(12) United States Patent
Liu et al.

(10) Patent No.: US 12,278,276 B2
(45) Date of Patent: Apr. 15, 2025

(54) MULTI-CHANNEL DEVICES AND METHOD WITH ANTI-PUNCH THROUGH PROCESS

(71) Applicant: Taiwan Semiconductor Manufacturing Company, Ltd., Hsin-Chu (TW)

(72) Inventors: Ko-Cheng Liu, Hsinchu (TW); Chang-Miao Liu, Hsinchu (TW); Ming-Lung Cheng, Kaohsiung County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 459 days.

(21) Appl. No.: 17/460,514

(22) Filed: Aug. 30, 2021

(65) Prior Publication Data

US 2023/0068668 A1 Mar. 2, 2023

(51) Int. Cl.
| | |
|---|---|
| *H01L 29/66* | (2006.01) |
| *H01L 21/02* | (2006.01) |
| *H01L 21/8238* | (2006.01) |
| *H01L 27/092* | (2006.01) |
| *H01L 29/06* | (2006.01) |
| *H01L 29/423* | (2006.01) |
| *H01L 29/786* | (2006.01) |

(52) U.S. Cl.
CPC .. *H01L 29/66537* (2013.01); *H01L 21/02129* (2013.01); *H01L 21/823807* (2013.01); *H01L 21/823878* (2013.01); *H01L 27/092* (2013.01); *H01L 29/0665* (2013.01); *H01L 29/42392* (2013.01); *H01L 29/66742* (2013.01); *H01L 29/78645* (2013.01); *H01L 29/78696* (2013.01)

(58) Field of Classification Search
CPC ......... H01L 29/66537; H01L 21/02129; H01L 21/823807; H01L 21/823878; H01L 29/0665; H01L 29/42392; H01L 29/66742; H01L 29/78645; H01L 29/78696

See application file for complete search history.

(56) References Cited

U.S. PATENT DOCUMENTS

| | | | |
|---|---|---|---|
| 8,796,666 | B1 | 8/2014 | Huang et al. |
| 8,815,712 | B2 | 8/2014 | Wan et al. |
| 8,836,016 | B2 | 9/2014 | Wu et al. |
| 8,841,701 | B2 | 9/2014 | Lin et al. |
| 8,847,293 | B2 | 9/2014 | Lee et al. |
| 8,853,025 | B2 | 10/2014 | Zhang et al. |

(Continued)

*Primary Examiner* — Yara B Green
*Assistant Examiner* — Fakeha Sehar
(74) *Attorney, Agent, or Firm* — HAYNES AND BOONE, LLP

(57) ABSTRACT

Multi-gate devices and methods for fabricating such are disclosed herein. An exemplary method includes forming a diffusion blocking layer on a semiconductor substrate; forming channel material layers over the diffusion blocking layer; patterning the semiconductor substrate, the channel material layers, and the diffusion blocking layer to form a trench in the semiconductor substrate, thereby defining an active region being adjacent the trench; filling the trench with a dielectric material layer and a solid doping source material layer containing a dopant; and driving the dopant from the solid doping source material layer to the active region, thereby forming an anti-punch-through (APT) feature in the active region.

20 Claims, 19 Drawing Sheets

(56) References Cited

U.S. PATENT DOCUMENTS

| | | | |
|---|---|---|---|
| 8,962,400 B2 | 2/2015 | Tsai et al. | |
| 8,963,258 B2 | 2/2015 | Yu et al. | |
| 9,093,514 B2 | 7/2015 | Tsai et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,245,805 B2 | 1/2016 | Yeh et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 9,824,937 B1 * | 11/2017 | Wang | H01L 29/785 |
| 2013/0256845 A1 * | 10/2013 | Yin | H01L 21/76232 |
| | | | 257/E21.546 |
| 2013/0285116 A1 | 10/2013 | Lochtefeld et al. | |
| 2020/0105872 A1 * | 4/2020 | Glass | H01L 21/26513 |
| 2020/0411698 A1 * | 12/2020 | Kim | H01L 29/66439 |

* cited by examiner

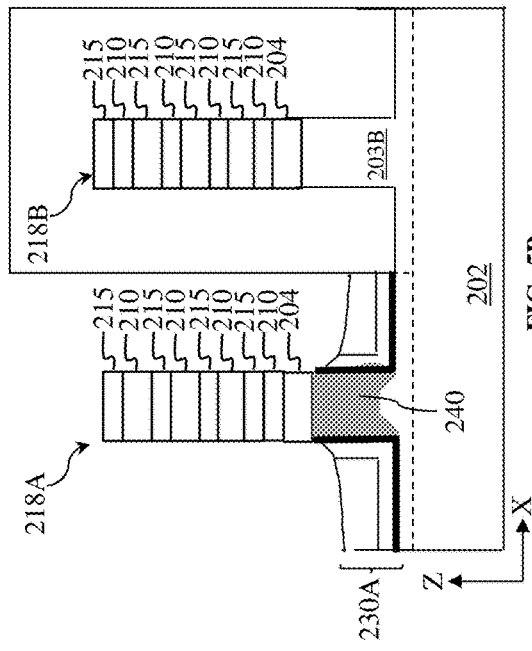
FIG. 5A
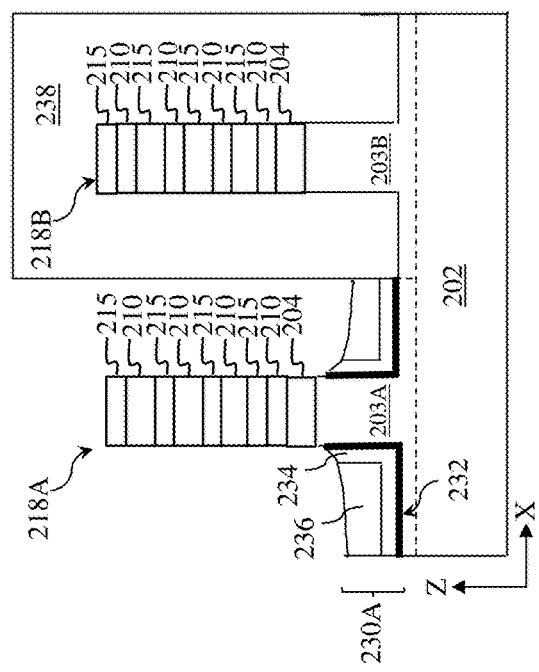
FIG. 5B
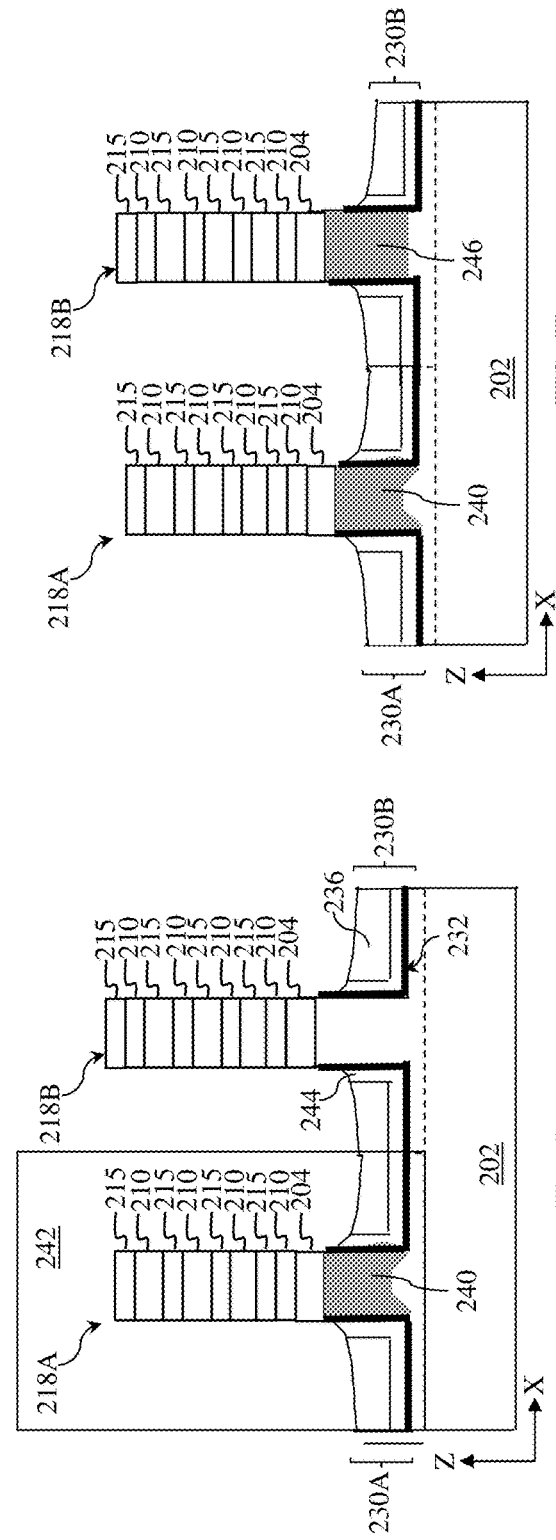
FIG. 5C
FIG. 5D

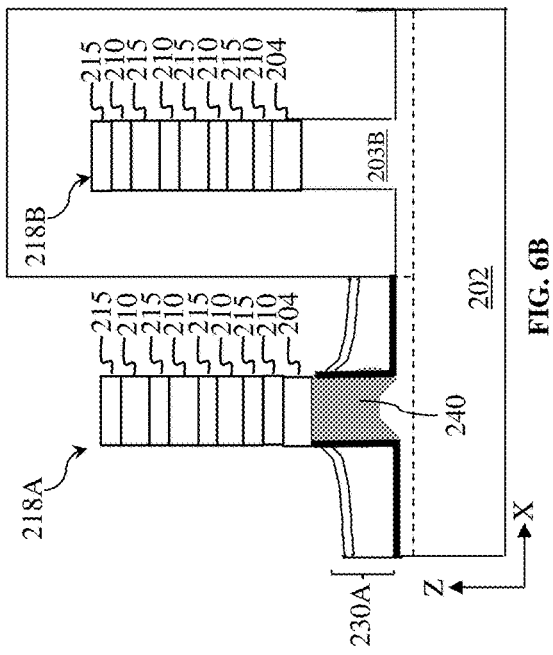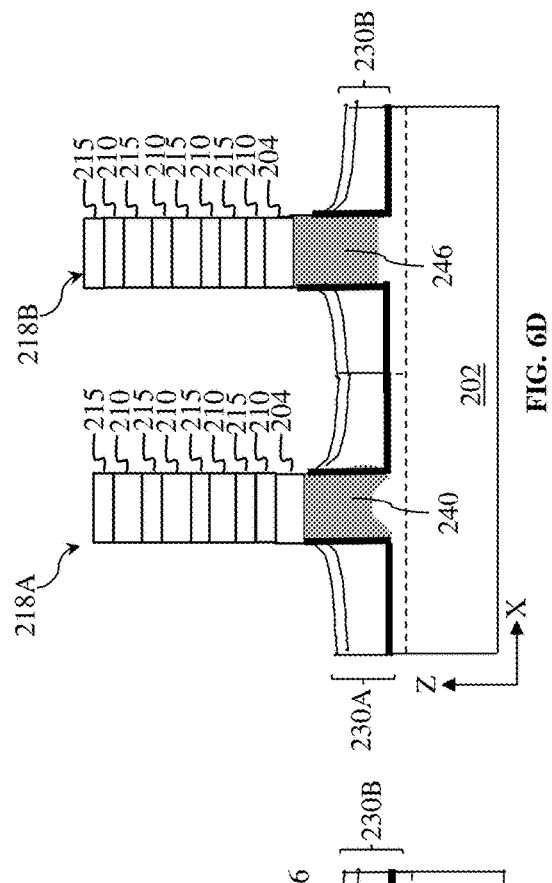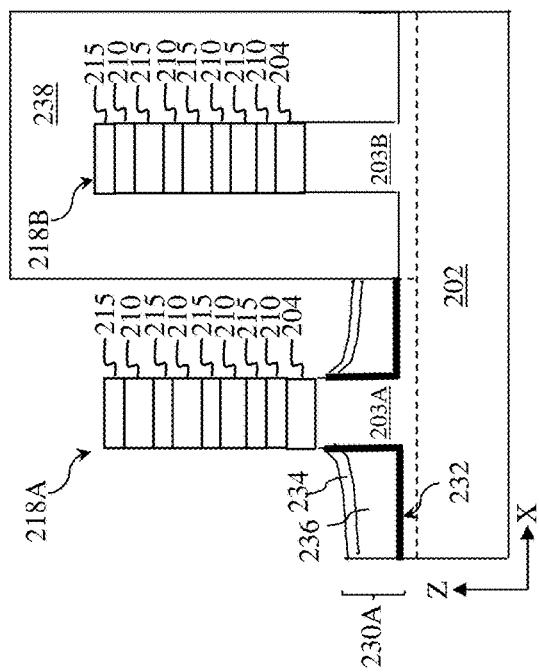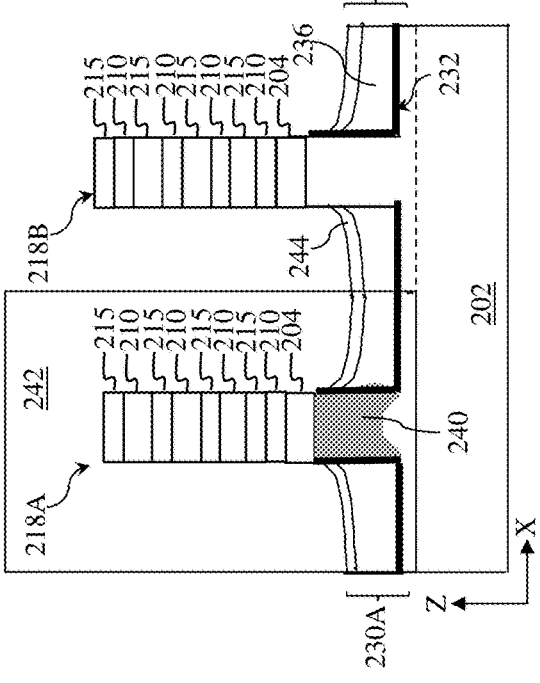

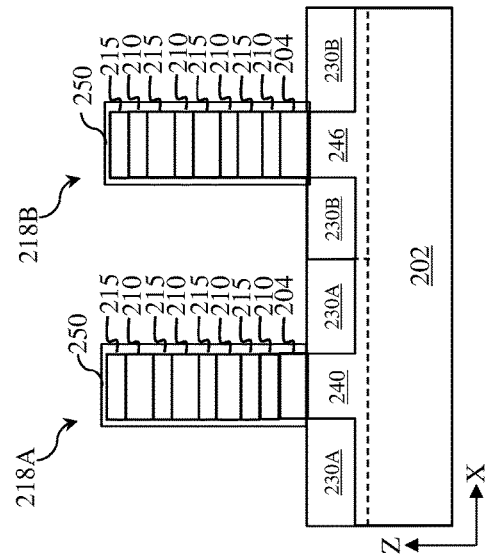
FIG. 7A
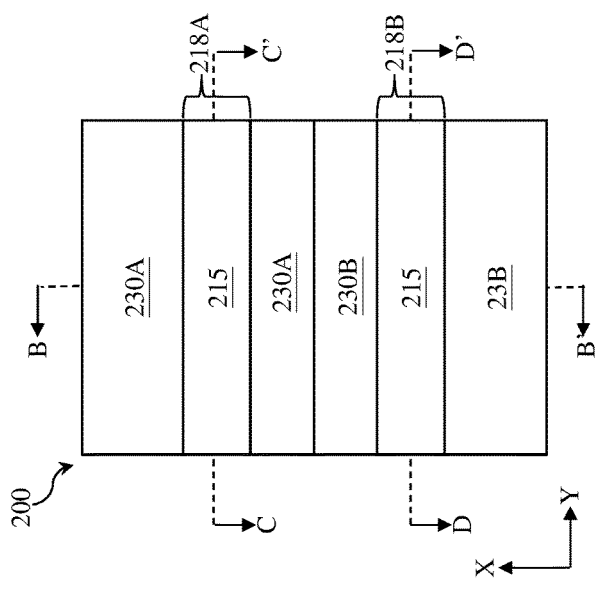
FIG. 7B
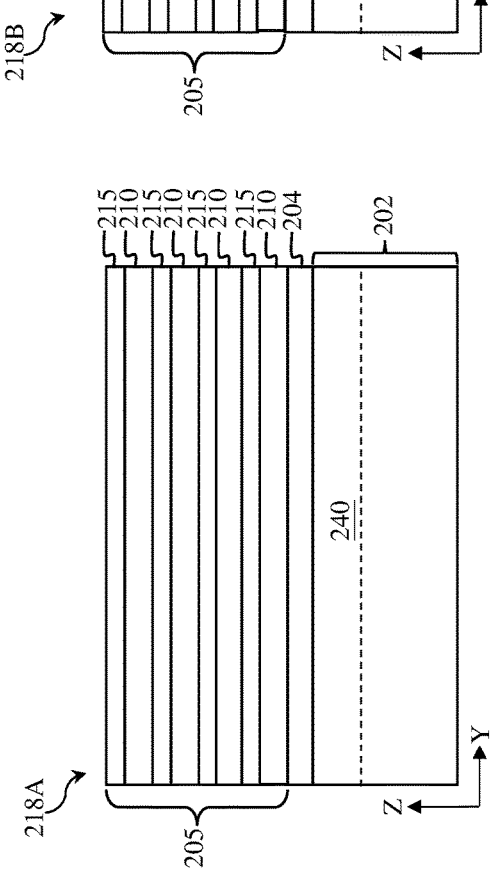
FIG. 7C
FIG. 7D

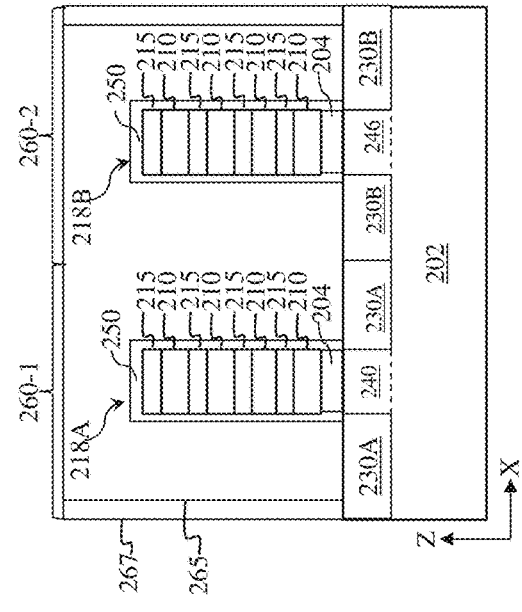
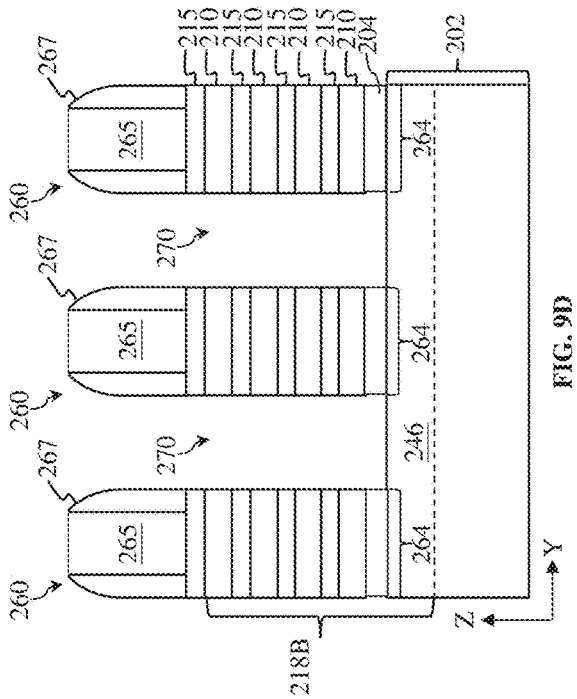
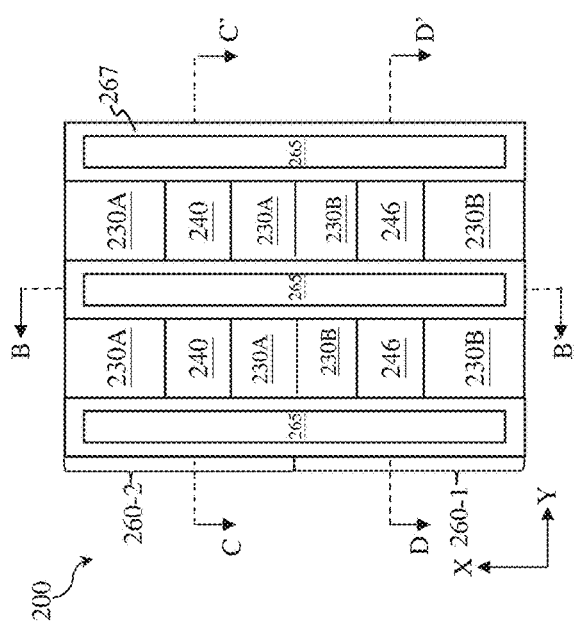
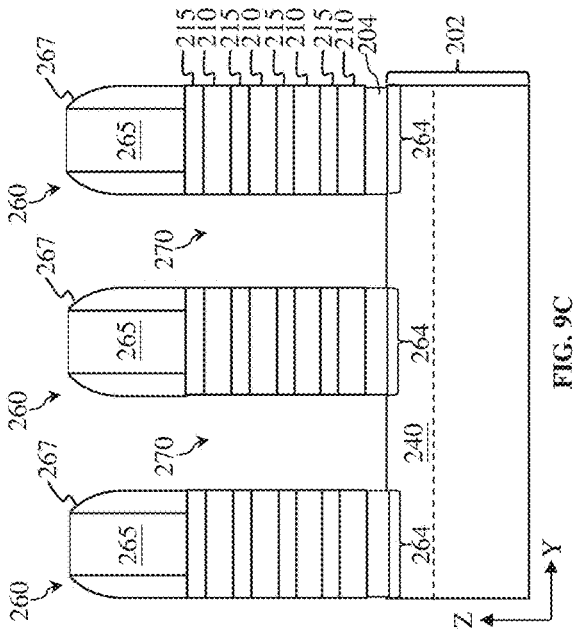

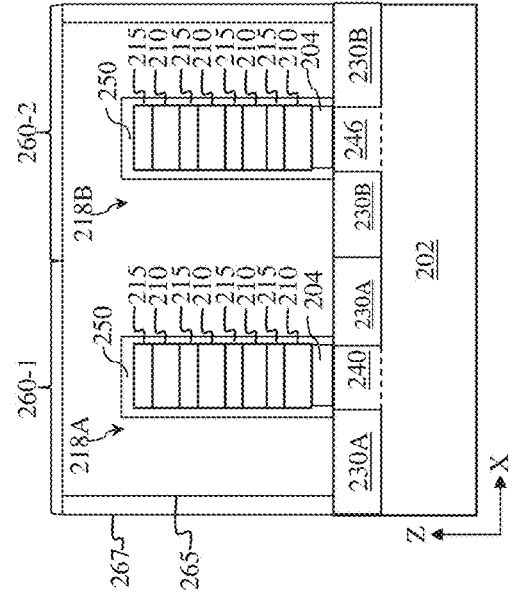
FIG. 10B
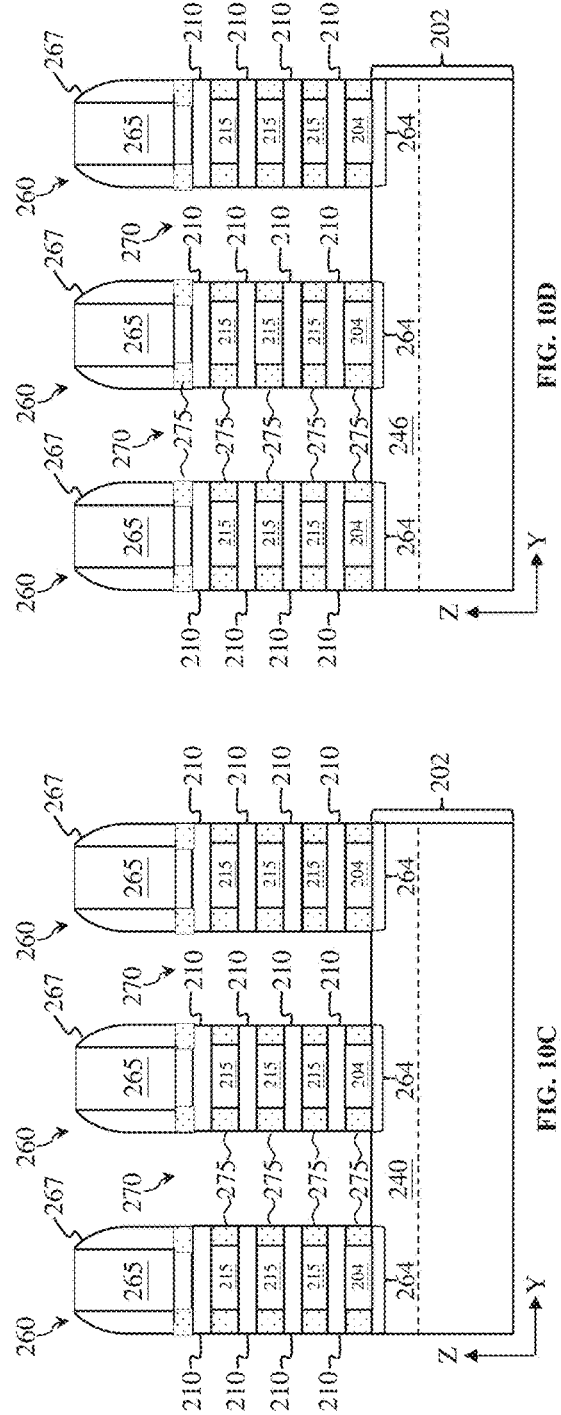
FIG. 10D
FIG. 10C
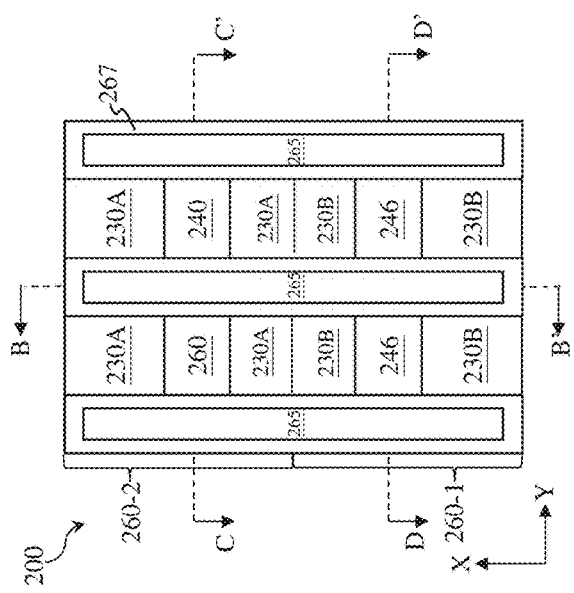
FIG. 10A

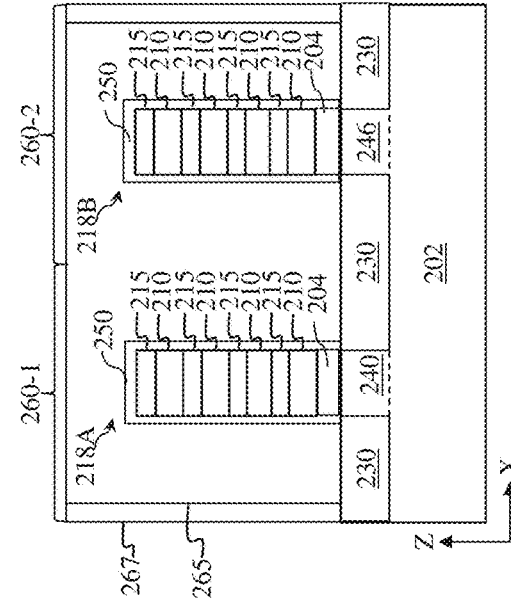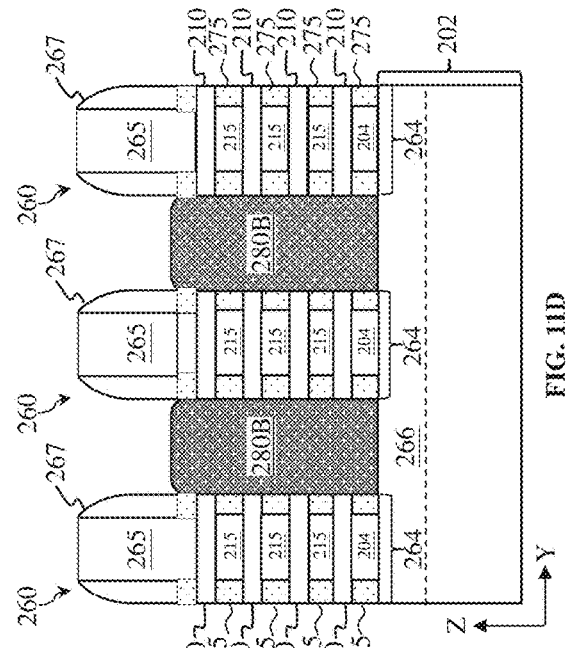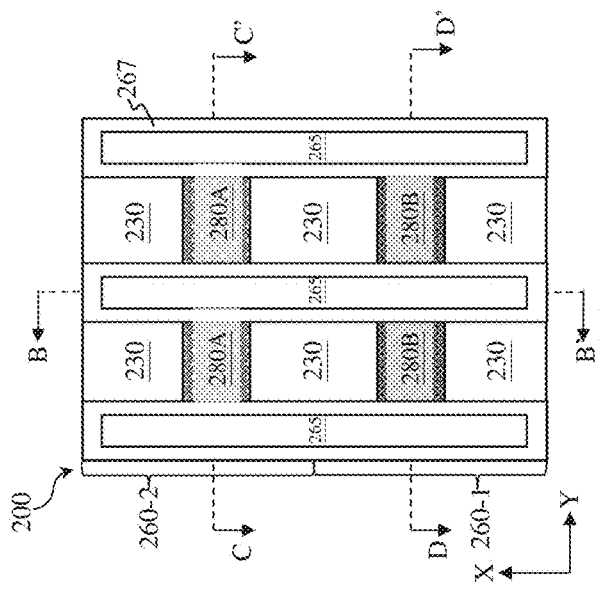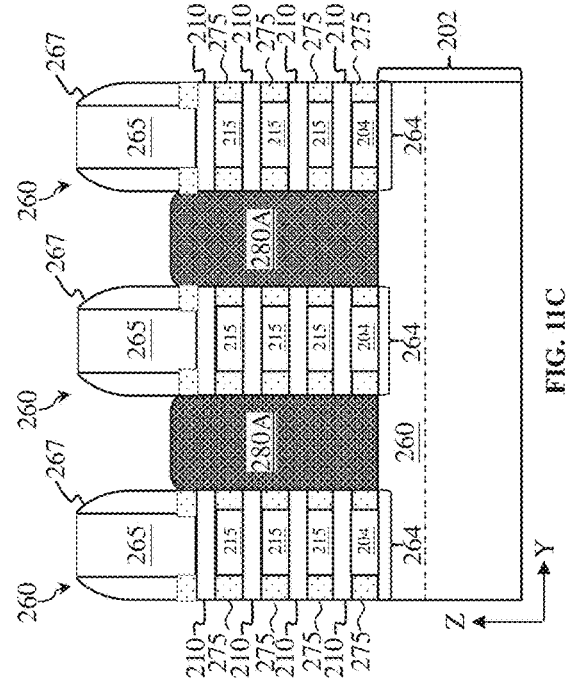
FIG. 11A
FIG. 11B
FIG. 11C
FIG. 11D

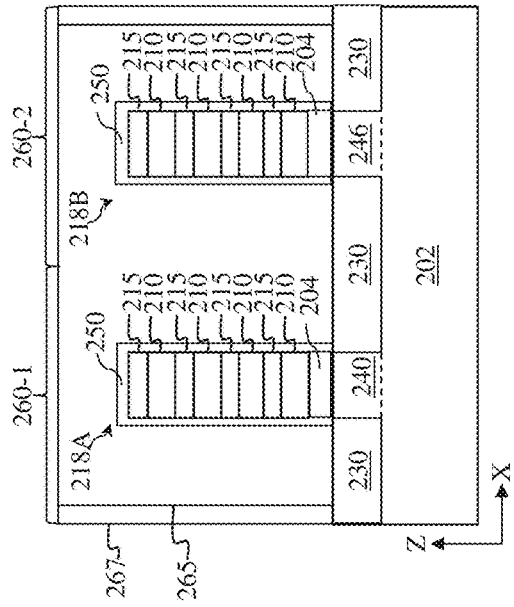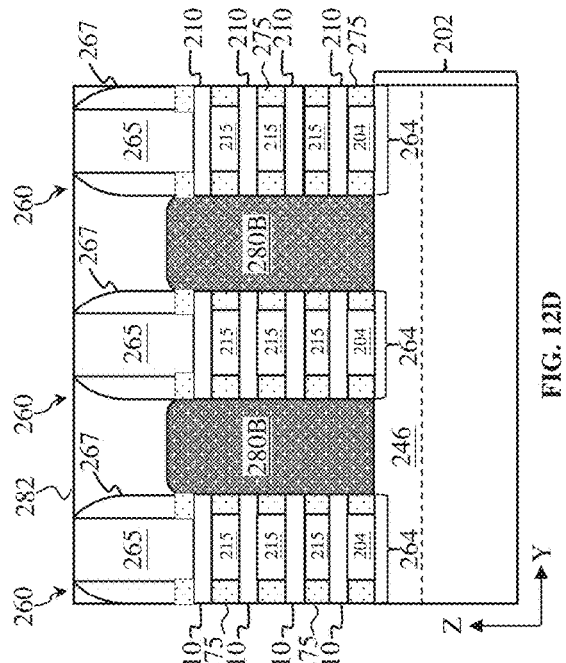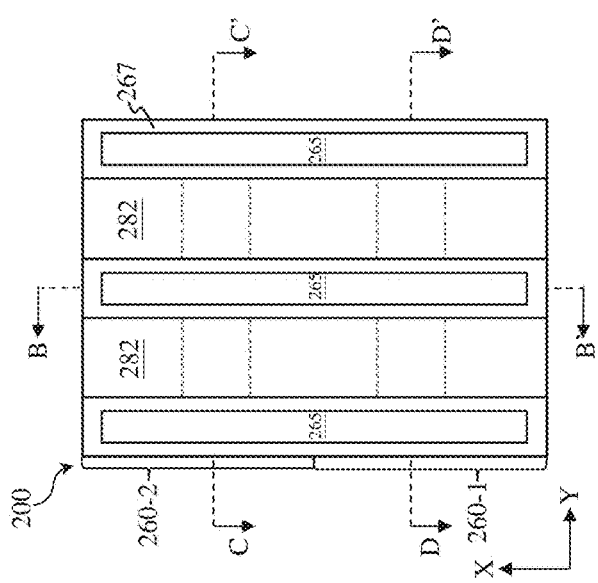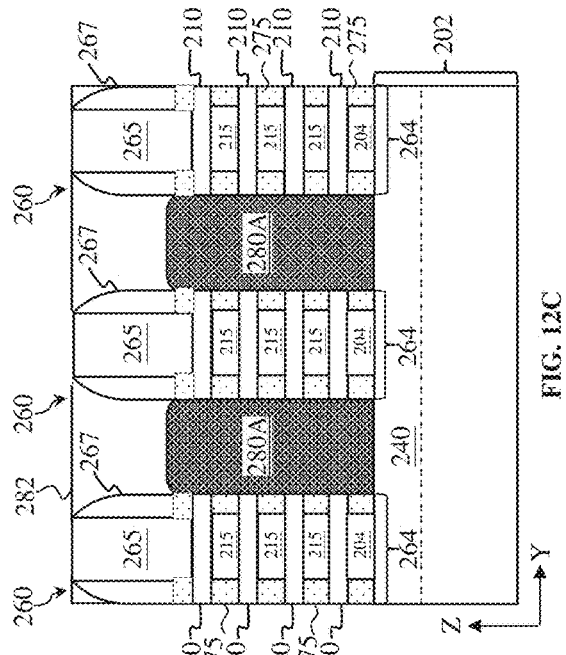
FIG. 12A
FIG. 12B
FIG. 12C
FIG. 12D

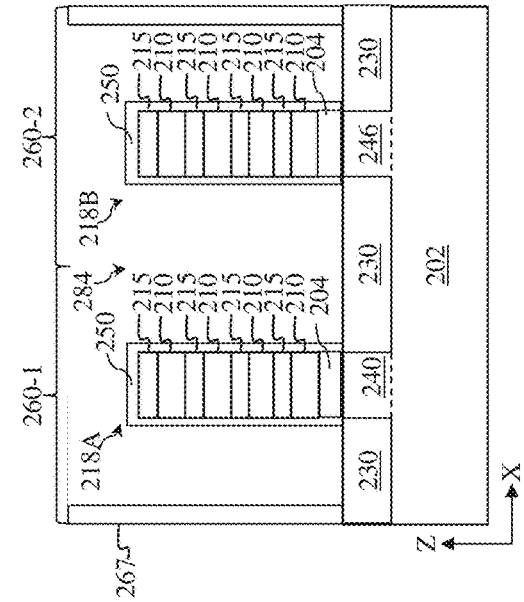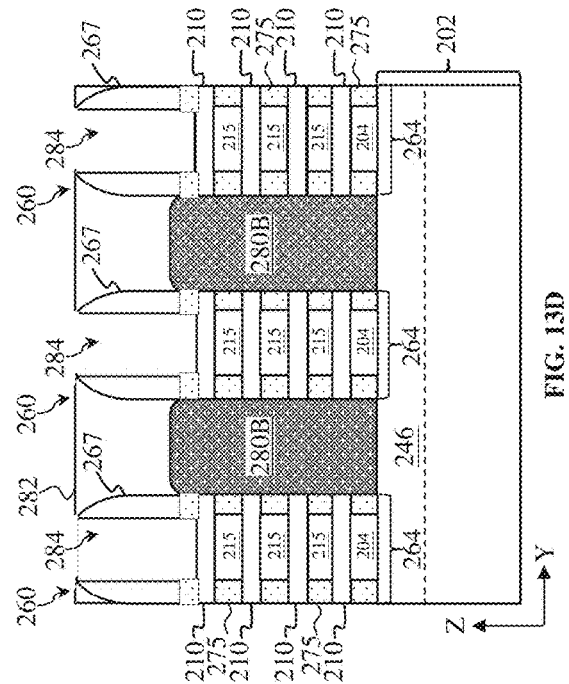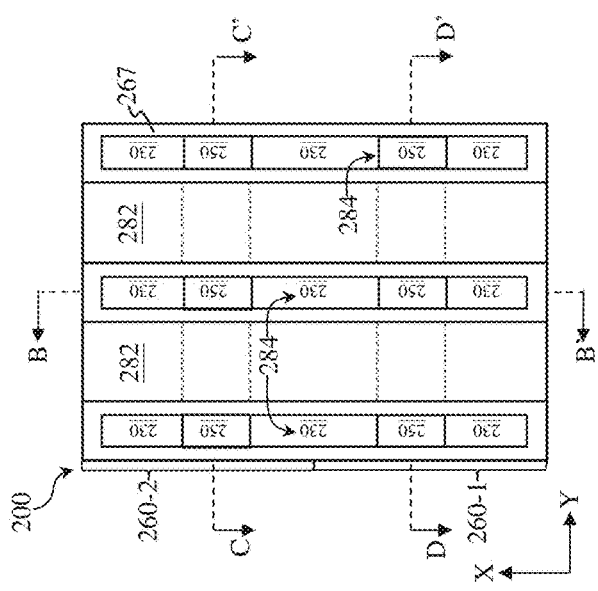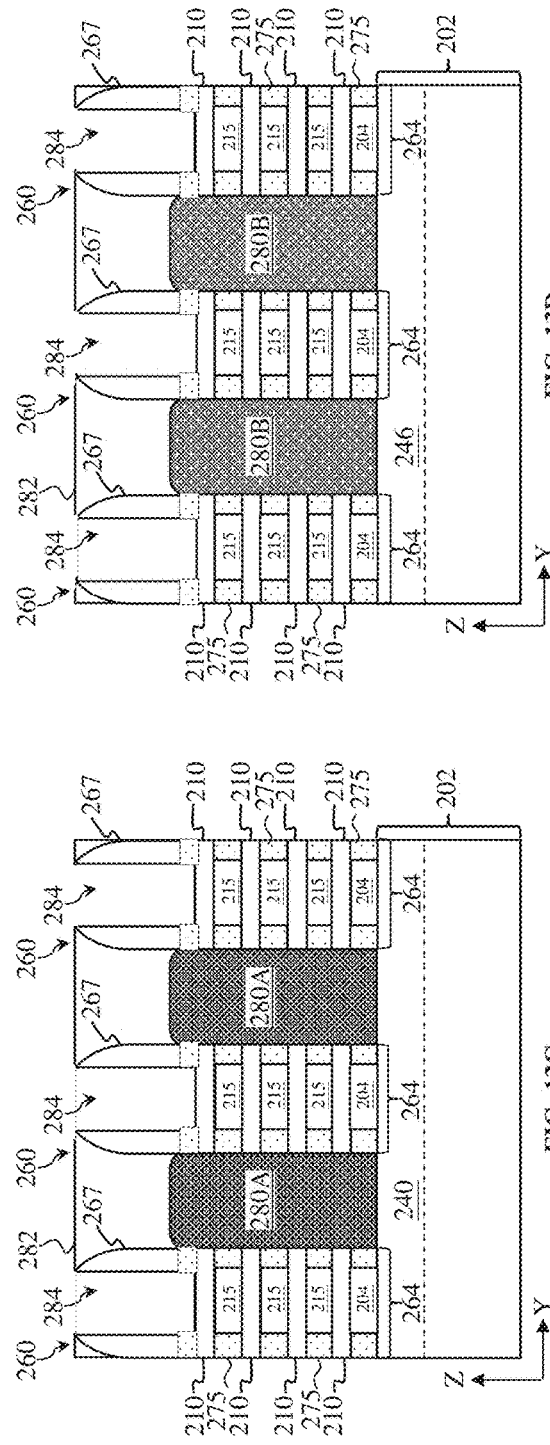
FIG. 13A
FIG. 13B
FIG. 13C
FIG. 13D

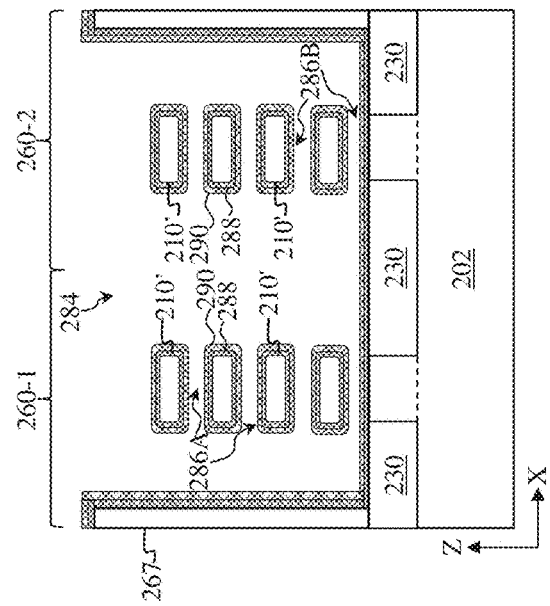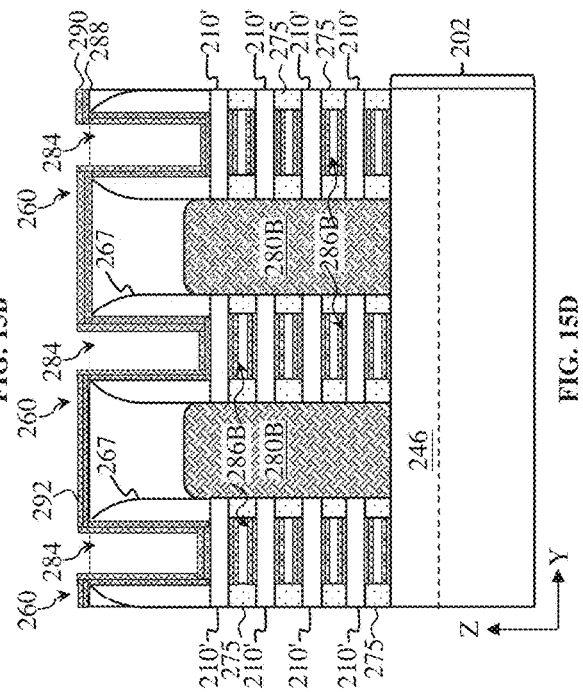
FIG. 15A
FIG. 15B
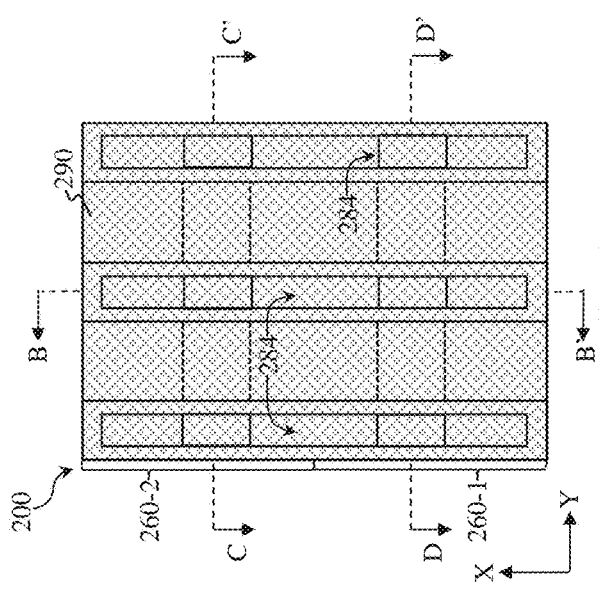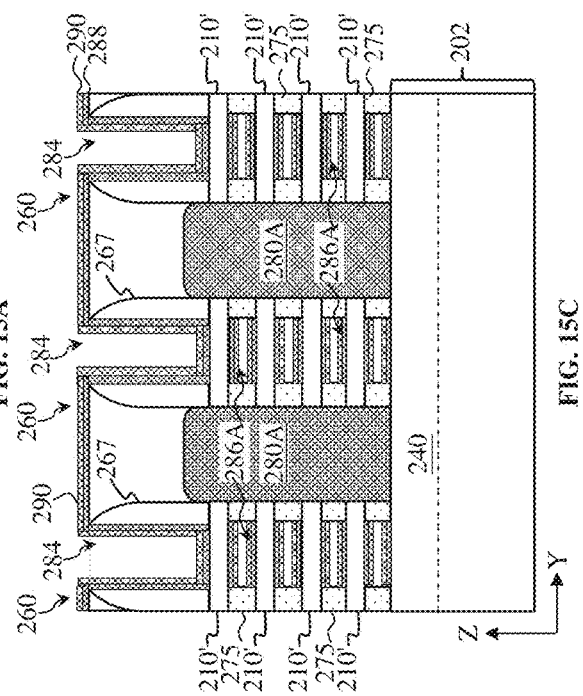
FIG. 15C
FIG. 15D

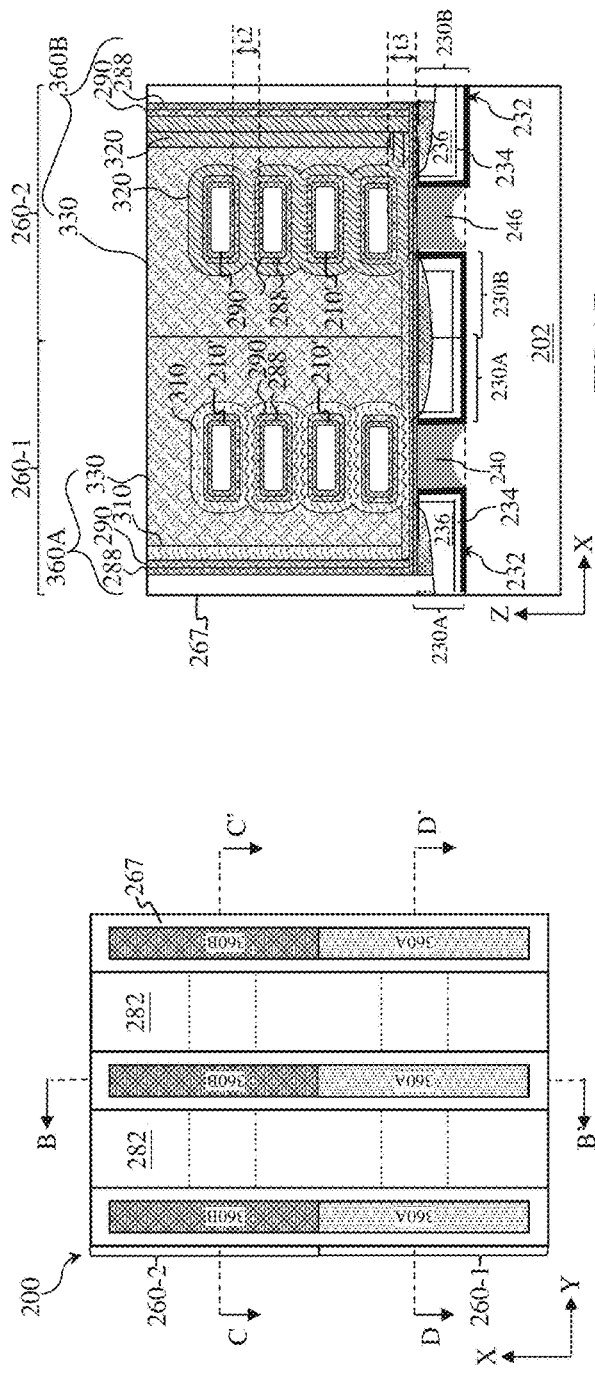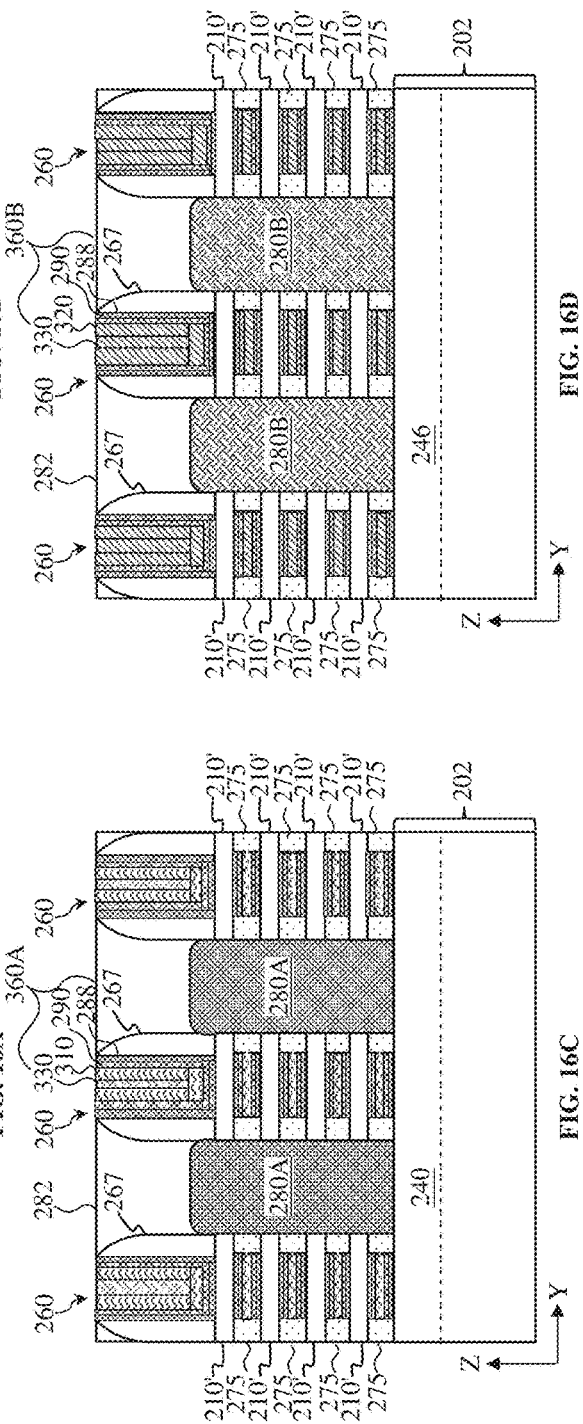

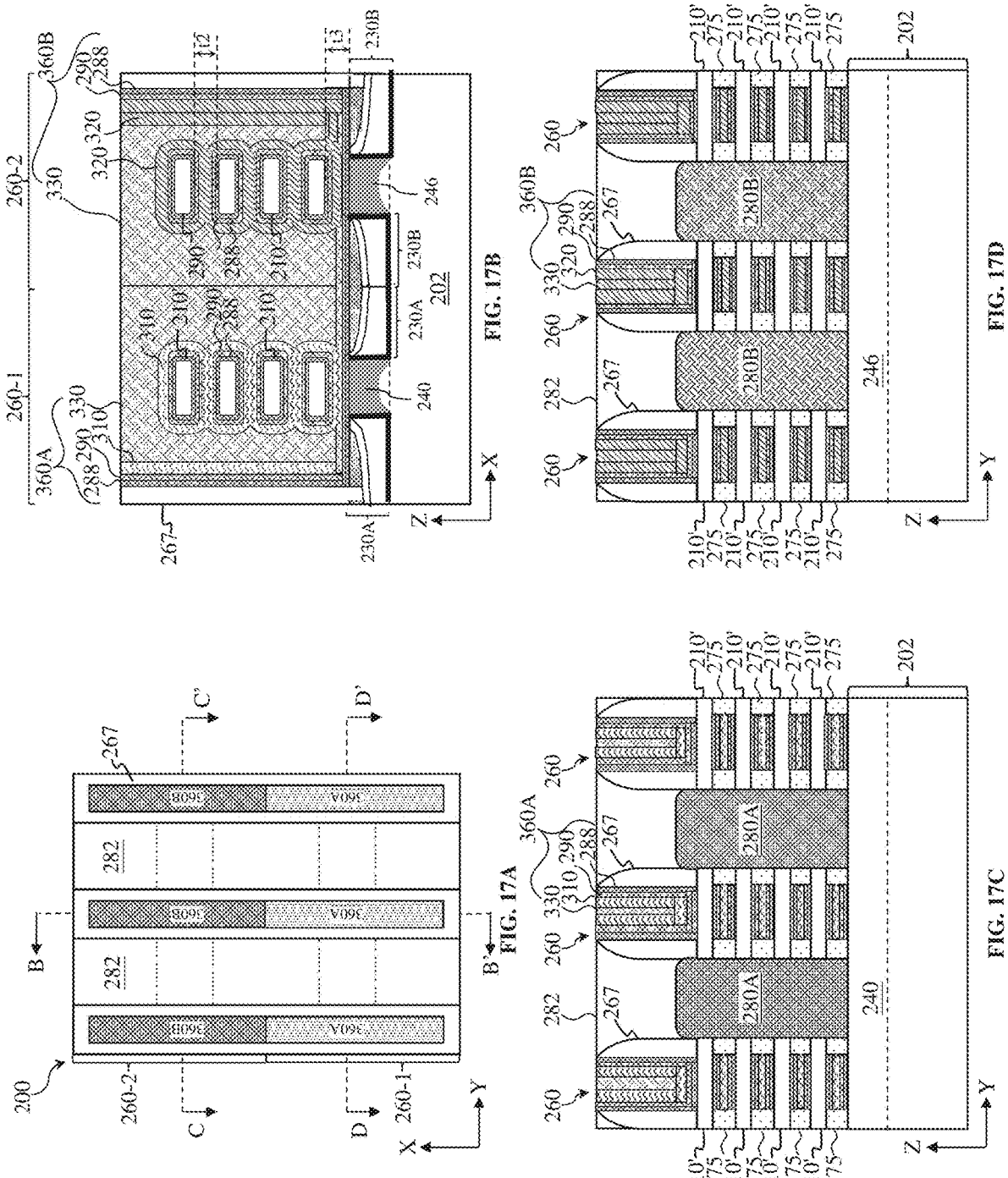

MULTI-CHANNEL DEVICES AND METHOD WITH ANTI-PUNCH THROUGH PROCESS

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Recently, multigate devices have been introduced to improve gate control. Multigate devices have been observed to increase gate-channel coupling, reduce OFF-state current, and/or reduce short-channel effects (SCEs). One such multigate device is the gate-all around (GAA) device (also referred to multi-channel devices), which includes stacked multiple channels and a gate structure that can extend, partially or fully, around multiple channels to provide access to the channel region on at least two sides. GAA devices enable aggressive scaling down of IC technologies, maintaining gate control and mitigating SCEs, while seamlessly integrating with conventional IC manufacturing processes. As GAA devices continue to scale, various challenges have arisen. For example, anti-punch-through implantation cannot be properly implemented to achieve desired effect, degradation of the mobility and other device performance occurs due to dopant diffusion in the channel region, and other concerns, especially for the high mobility channel. Therefore, what is needed is the structure for integrated circuit structure and the method making the same to address the above issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-4A, FIGS. 2B-4B, FIGS. 2C-4C, and FIGS. 2D-4D are fragmentary diagrammatic views of a multigate device, in portion or entirety, at various fabrication stages (such as those associated with the method in FIG. 1A) according to various aspects of the present disclosure.

FIGS. 5A, 5B, 5C and 5D are fragmentary diagrammatic views of a multigate device, in portion or entirety, at various fabrication stages (such as those associated with the method in FIG. 1B) according to various aspects of the present disclosure.

FIGS. 6A, 6B, 6C and 6D are fragmentary diagrammatic views of a multigate device, in portion or entirety, at various fabrication stages (such as those associated with the method in FIG. 1C) according to various aspects of the present disclosure.

FIGS. 7A-17A, FIGS. 7B-17B, FIGS. 7C-17C, and FIGS. 7D-17D are fragmentary diagrammatic views of a multigate device, in portion or entirety, at various fabrication stages (such as those associated with the method in FIG. 1D) according to various aspects of the present disclosure.

DETAILED DESCRIPTION

Figure 1A:
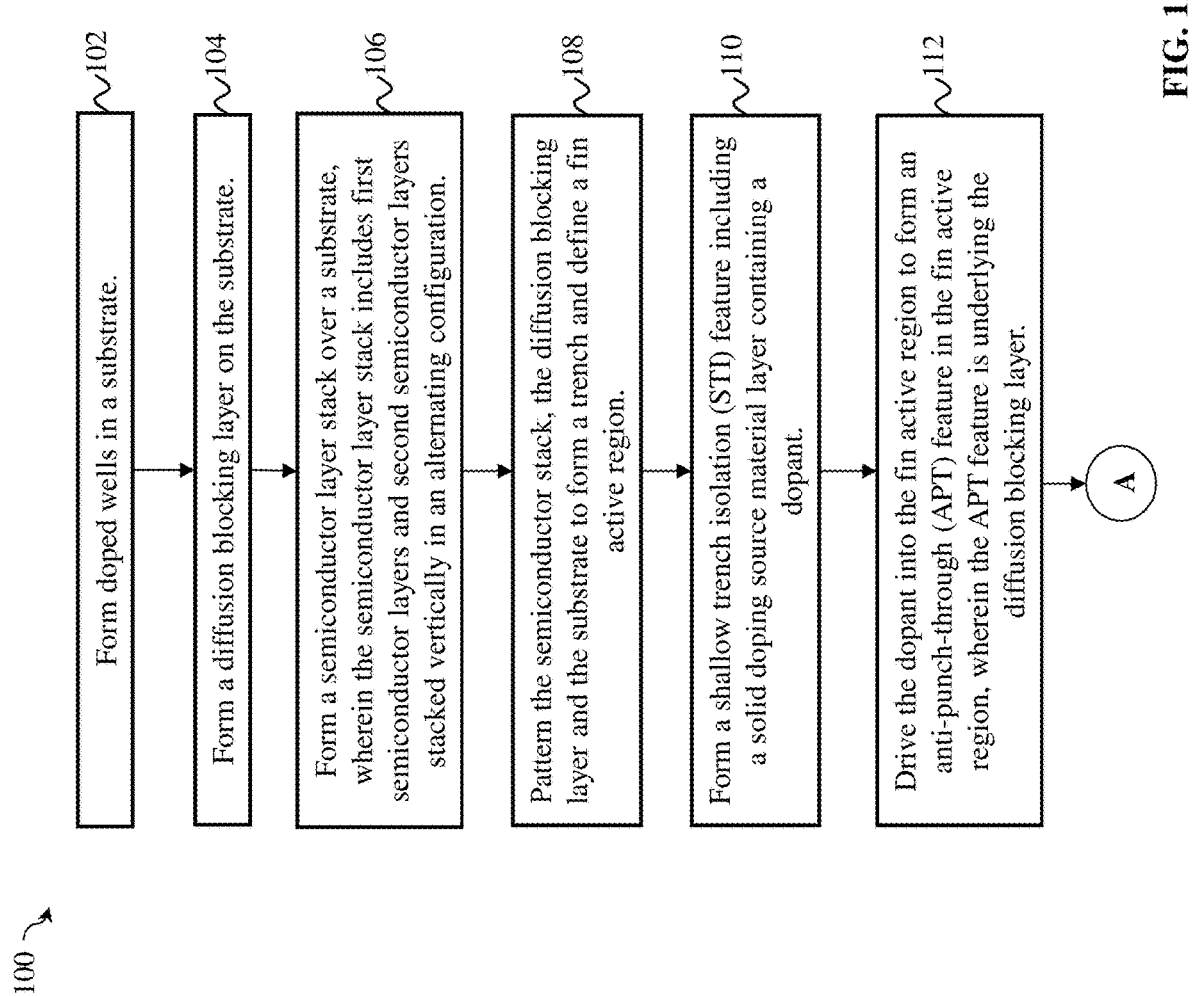
FIGS. 1A, 1B, 1C and 1D are a flow chart of a method for fabricating a multigate device according to various aspects of the present disclosure.

The present disclosure relates generally to integrated circuit devices, and more particularly, to multigate devices, such as gate-all-around (GAA) devices.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

Further, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used herein for ease of description to describe one element or feature's relationship to another element(s) or feature(s). The spatially relative terms are intended to encompass different orientations than as depicted of a device (or system or apparatus) including the element(s) or feature(s), including orientations associated with the device's use or operation. The apparatus may be otherwise oriented (rotated 90 degrees or at other orientations) and the spatially relative descriptors used herein may likewise be interpreted accordingly. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

FIG. 1A, FIG. 1B, FIG. 1C and FIG. 1D are a flow chart of a method 100 for fabricating a multigate device according to various aspects of the present disclosure. In some embodiments, method 100 fabricates a multi-gate device that includes n-type GAA transistors and p-type GAA transistors. At block 102, doped wells, such as n-type wells and p-type wells, are formed in a substrate. For example, a patterned mask is formed by a procedure that including deposition, lithography process and etching to cover n-type field-effect transistor (nFET) regions, perform an implantation using a p-type dopant, such as boron, to form a p-type doped wells (p-wells), and then n-type doped wells are similarly formed in p-type field-effect transistor (pFET) regions. For examples, another patterned mask is formed by a procedure that including deposition, lithography process and etching to cover pFET regions, perform an implantation using an n-type dopant, such as phosphorous, to form an n-type doped wells (n-wells). Alternatively, n-wells are formed first and then p-wells are formed afterward with similar procedures. At block 104, a diffusion blocking layer is formed on the substrate. The diffusion blocking layer has a composition and a thickness to effectively prevent from dopant from diffusing into channel layers. The diffusion blocking layer includes a semiconductor material epitaxially grown on the substrate. At block 106, a semiconductor layer stack is formed over the diffusion blocking layer. The semiconductor layer stack includes first semiconductor layers and second semiconductor layers stacked vertically in an alternating configuration. At block 108, the semiconductor stack, the diffusion blocking layer and the substrate are patterned to form a trench and define a fin active region. At block 110, a shallow trench isolation (STI) feature is formed in the trench, wherein the STI feature includes a solid dielectric material layer containing a dopant. The solid dielectric material layer is also referred to as a solid doping source material layer. The solid doping source material layer includes a borosilicate glass (BSG) layer according to the depicted embodiment. At block 112, the dopant is driven into the fin active region to form an anti-punch-through (APT) feature therein. The APT feature is underlying the diffusion blocking layer.

The STI feature with the solid doping source material layer is formed by the operation 110 according to various embodiments. The operation 110 includes multiple sub-operations and is further described according to some embodiments with reference to FIG. 1B. At block 114, a dielectric liner is formed in the trench, such as by deposition or thermal oxidation. At block 116, a solid doping source material layer is formed on the dielectric liner in the trench. At block 118, the trench is further filled with one or more dielectric material to form STI feature by a suitable process, such as deposition and chemical mechanical polishing (CMP). At block 120, the STI feature is recessed by selective etching, and accordingly the fin active region is formed and is extruded above the STI feature.

Figures 1B, 1C:
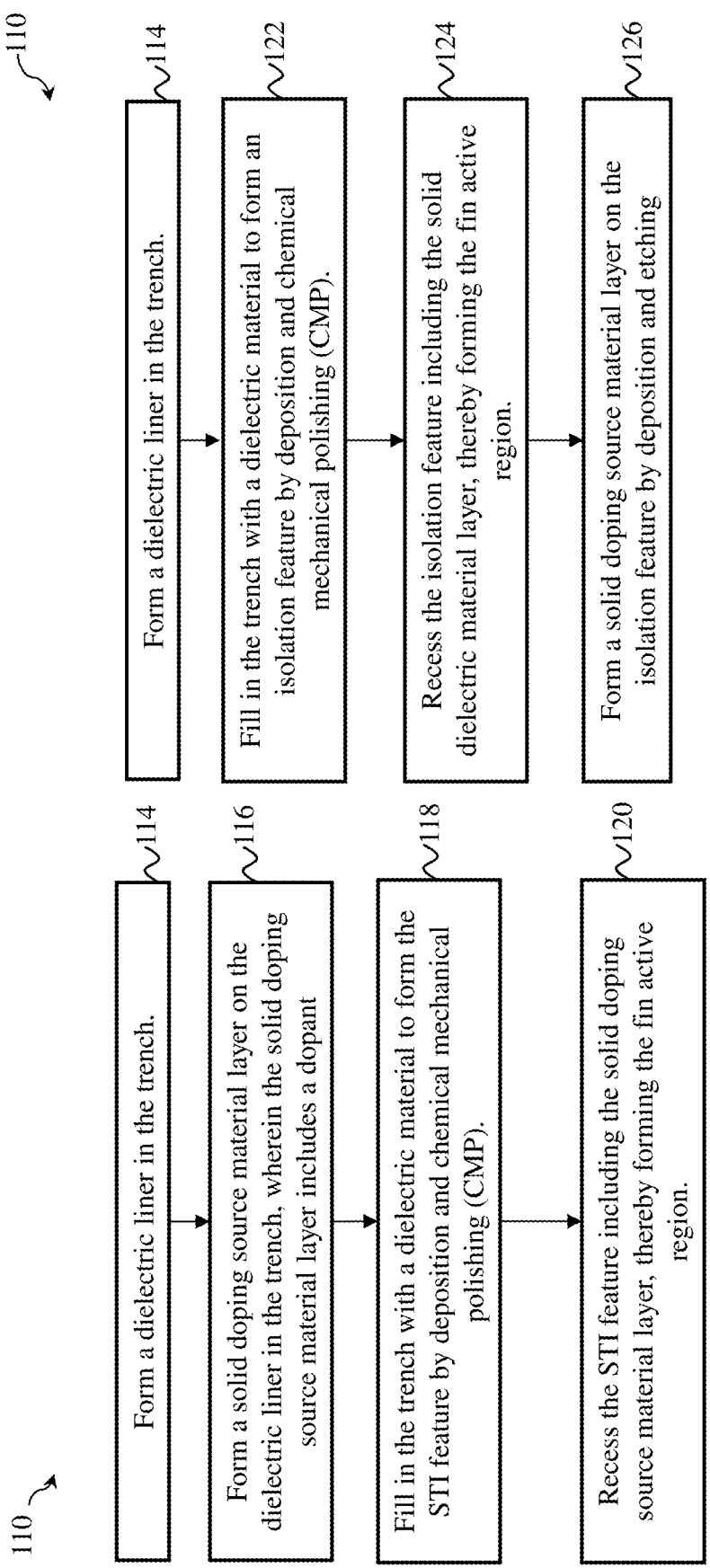

The operation 110 is described according to some other embodiments with reference to FIG. 1C. At block 114, a dielectric liner is formed in the trench. At block 122, the trench is further filled with one or more dielectric material to form a STI feature by a suitable process, such as deposition and CMP. At block 124, the STI feature is recessed by selective etching and the fin active region is formed and is extruded above the STI feature. At block 126, a solid doping source material layer is formed on the STI feature by a process, such as deposition and etching. In the present embodiment, the solid doping source material layer is formed on the top surface of the STI feature. The isolation feature and the solid doping source material layer collectively constitute the STI feature.

Figure 1D:
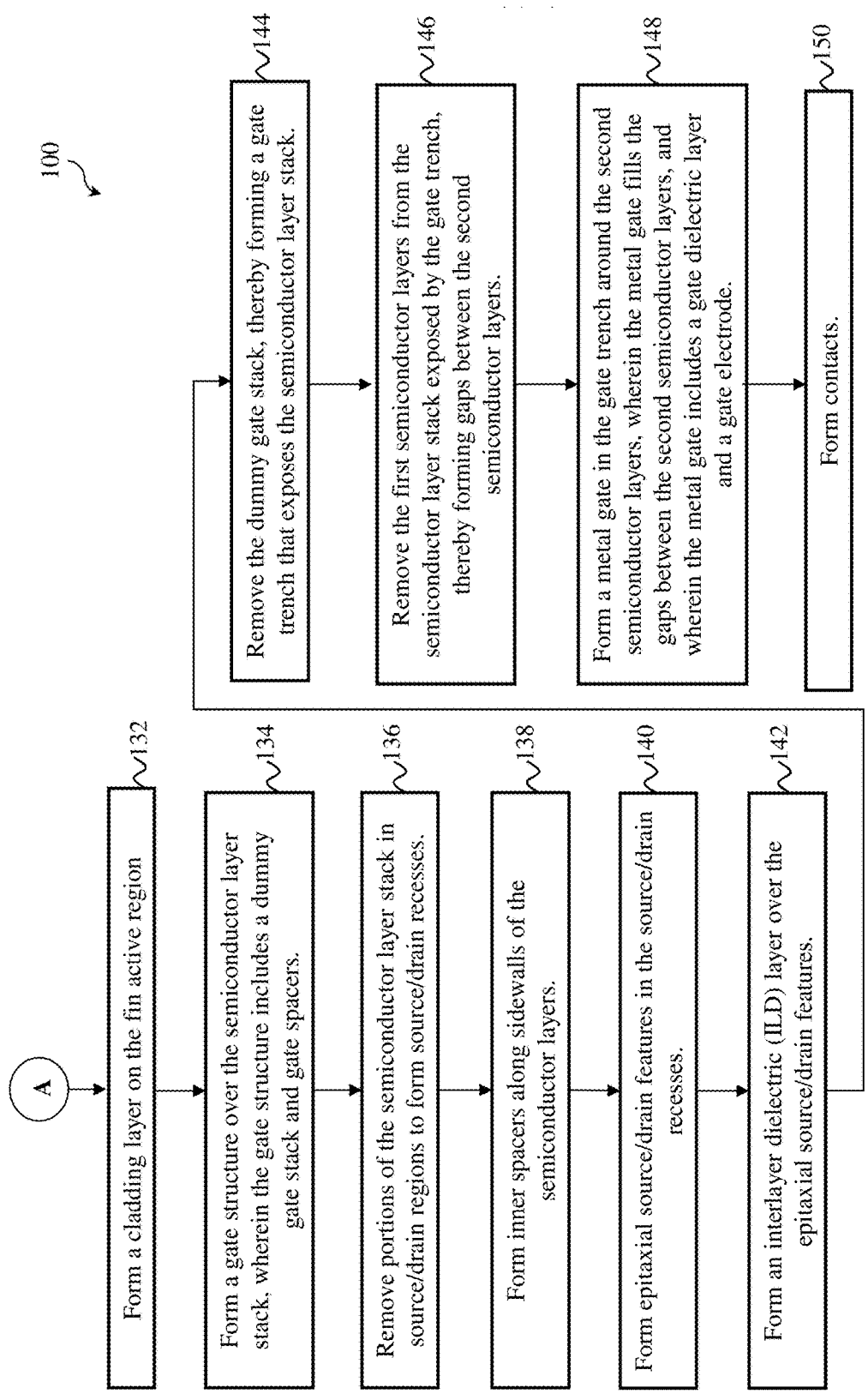
Figure 2A:
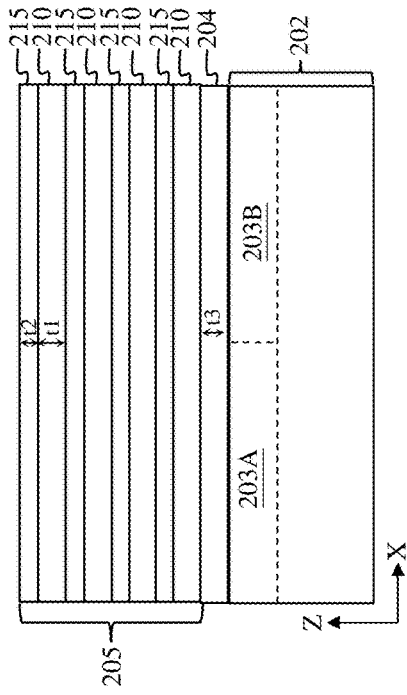
Figure 2B:
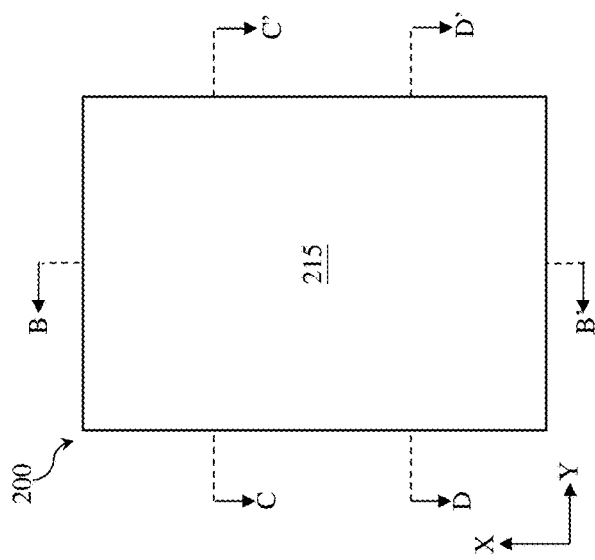
Figure 2C:
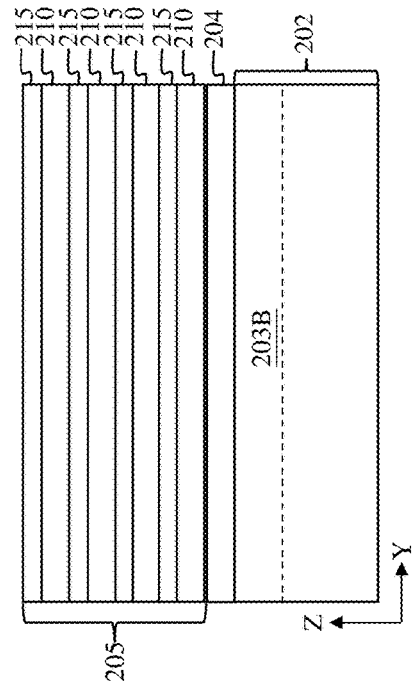
Figure 2D:
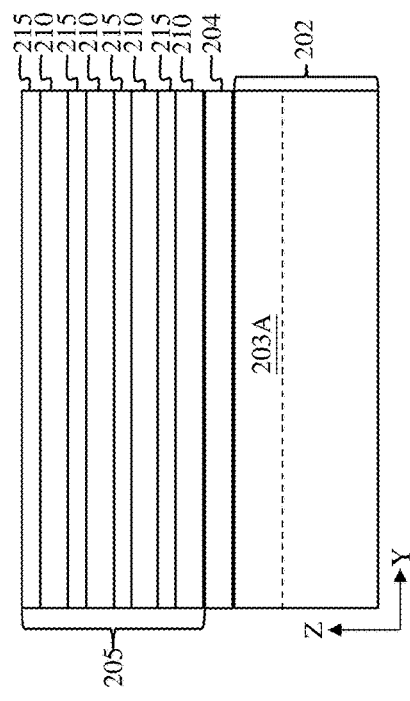
Figure 3B:
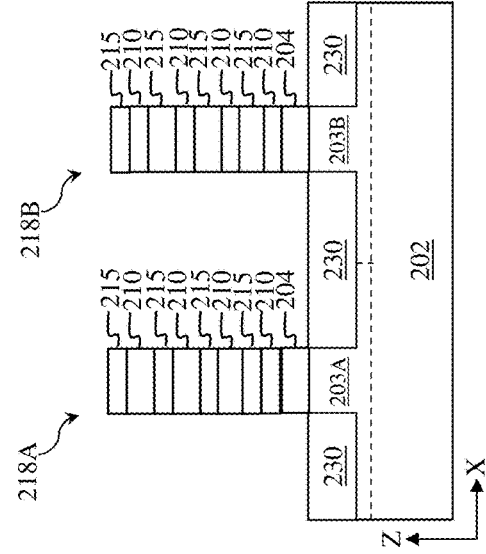
Figure 3D:
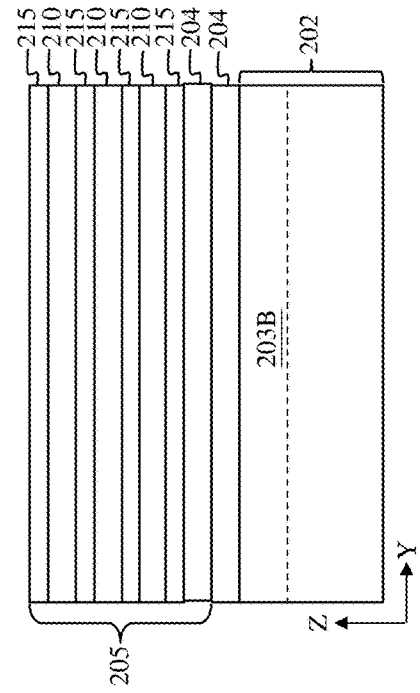
Figure 3A:
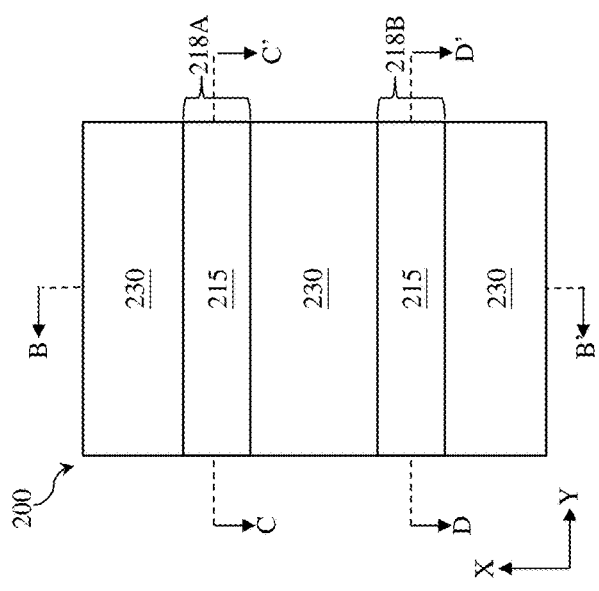
Figure 3C:
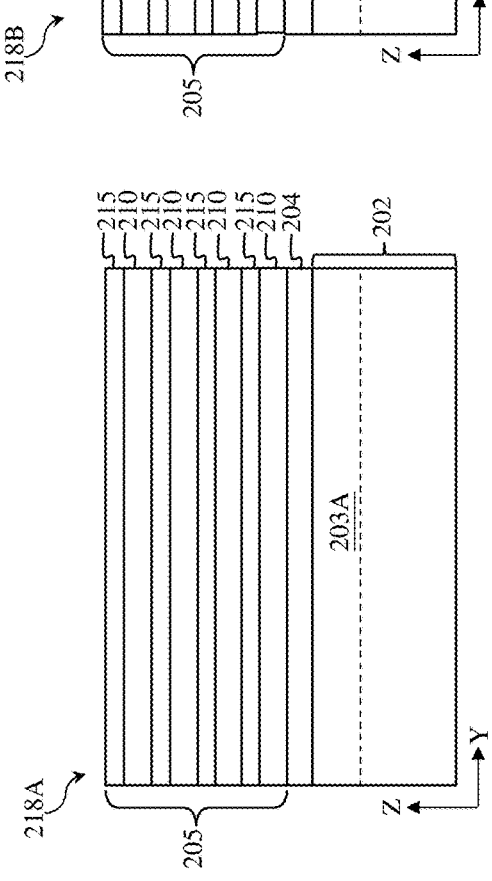

After the formation of the STI feature at block 110 and driving the dopant from the solid doping source material layer to form the APT feature in the fin active region at block 112, the method 100 continues to subsequent operations, which are described with reference to FIG. 1D. At block 132, a cladding layer is formed on sidewalls of the fin active region. In some embodiments, the cladding layer may include a semiconductor material with a composition similar to that of the second semiconductor material layers in the semiconductor layer stack. At block 134, a gate structure is formed over the semiconductor layer stack. The gate structure includes a dummy gate stack and gate spacers. At block 136, portions of the semiconductor layer stack in source/drain regions are removed to form source/drain recesses. At block 138, inner spacers are formed along sidewalls of the second semiconductor layers of the semiconductor layer stack. At block 140, epitaxial source/drain features are formed in the source/drain recesses. At block 142, an interlayer dielectric (ILD) layer is formed over the epitaxial source/drain features. At block 144, the dummy gate stack is removed, thereby forming a gate trench that exposes the semiconductor layer stack in a gate region. At block 146, the first semiconductor layers are removed from the semiconductor layer stack exposed by the gate trench, thereby forming gaps between the second semiconductor layers. At block 148, a metal gate is formed in the gate trench around the second semiconductor layers. The metal gate fills in the gaps between the second semiconductor layers and wrap around the second semiconductor layers. The metal gate includes a gate dielectric layer and a gate electrode. Method 100 then proceeds to block 150 where contacts are formed. Additional processing is contemplated by the present disclosure. Additional steps can be provided before, during, and after method 100, and some of the steps described can be moved, replaced, or eliminated for additional embodiments of method 100. The discussion that follows illustrates various embodiments of nanowire-based integrated circuit devices that can be fabricated according to method 100.

Figure 4B:
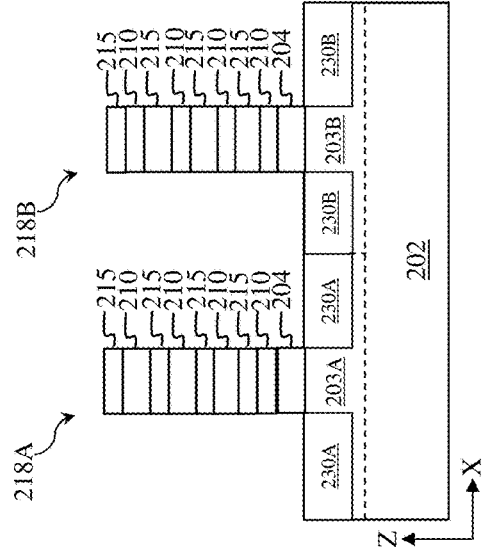
Figure 4D:
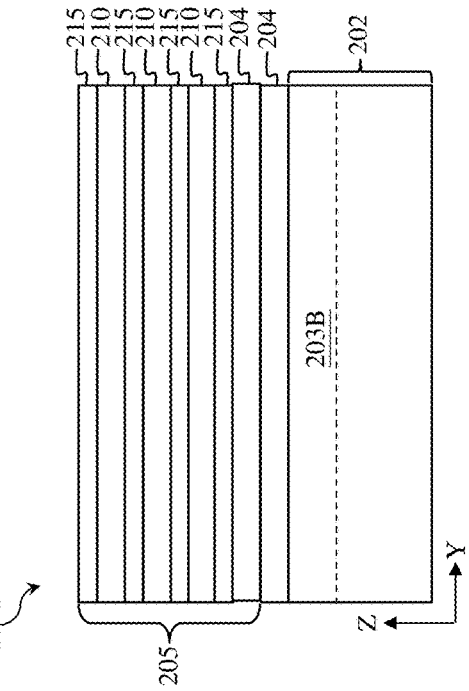
Figure 4A:
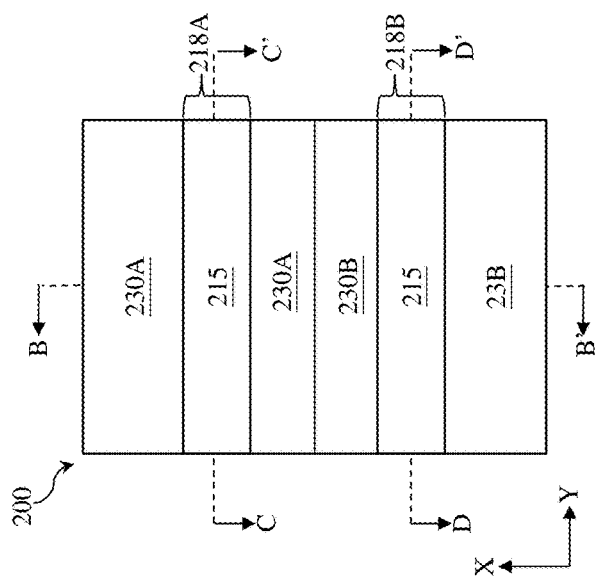
Figure 4C:
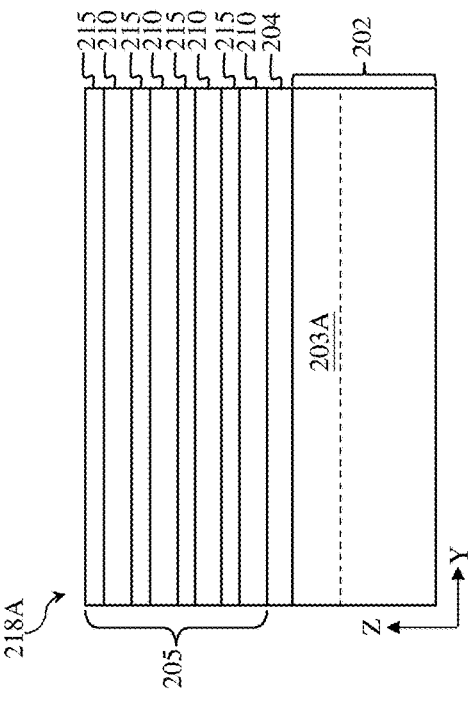
Figure 8A:
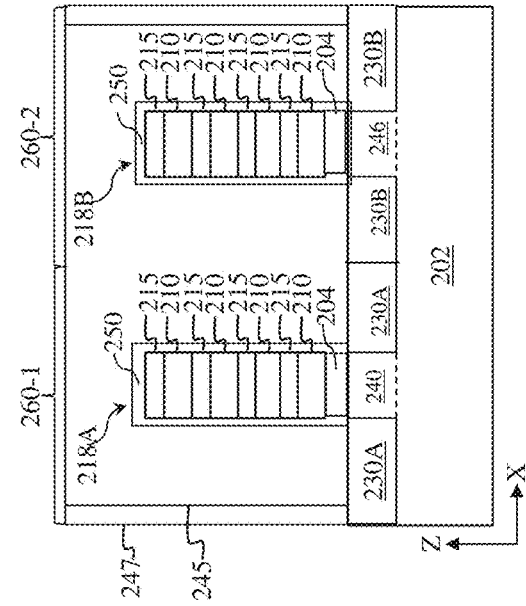
Figure 8B:
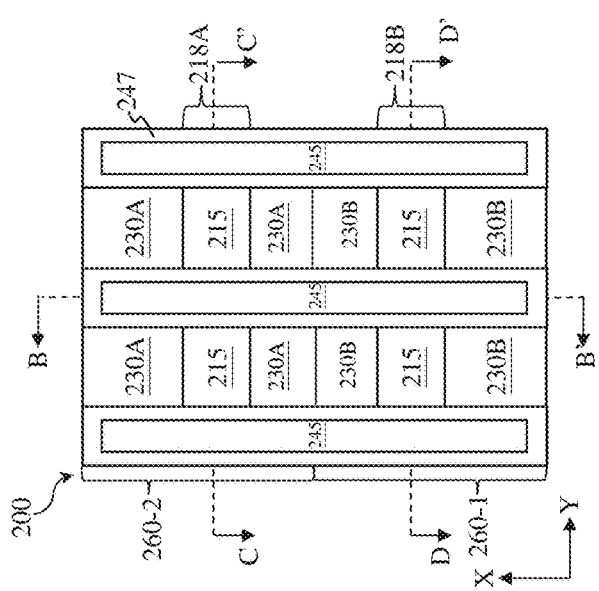
Figure 8C:
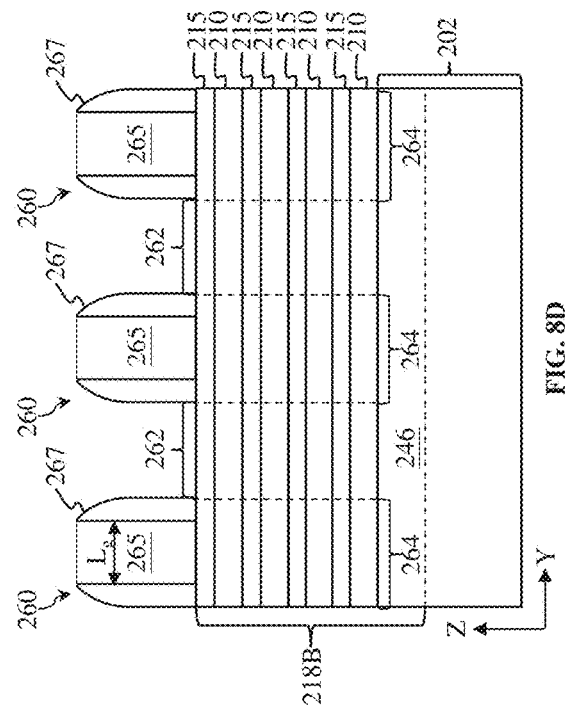
Figure 8D:
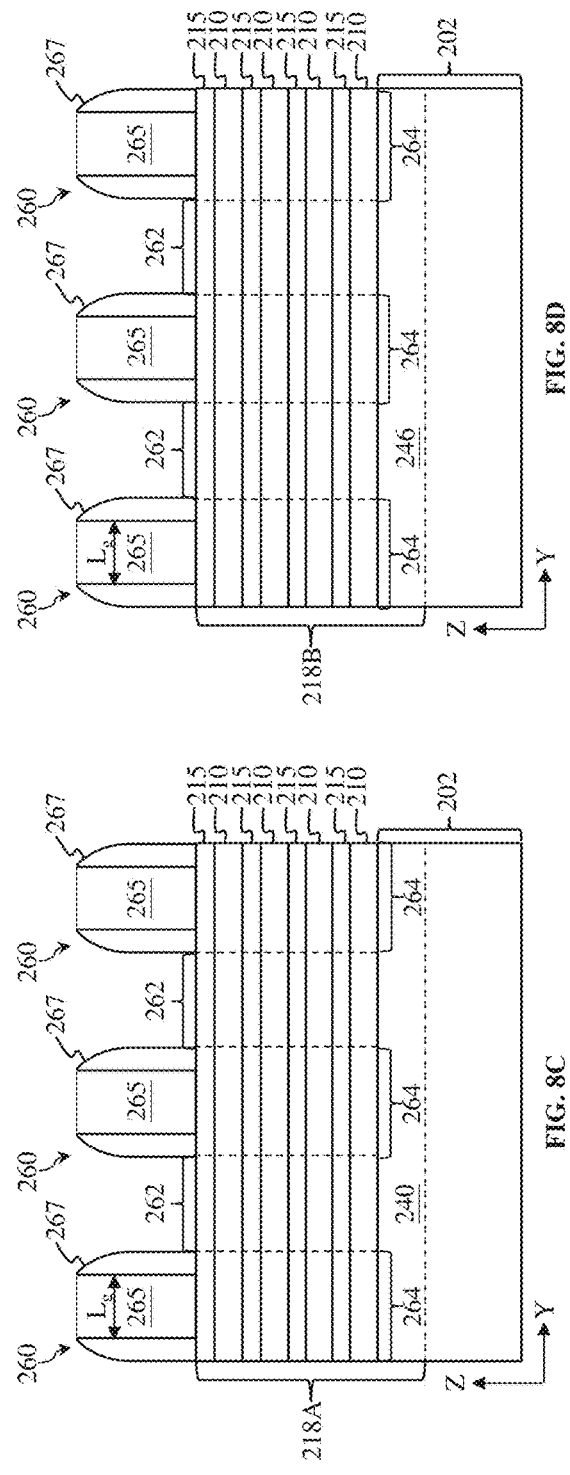
Figure 14A:
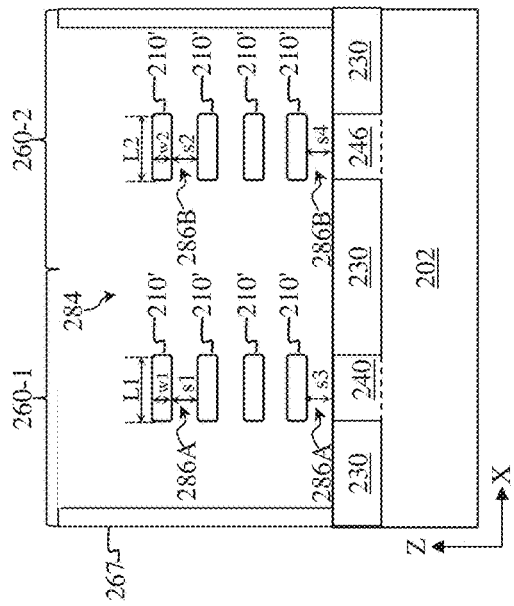
Figure 14B:
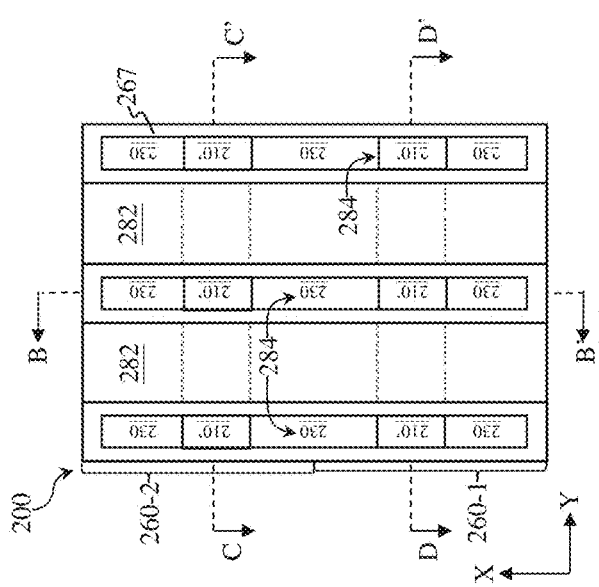
Figure 14C:
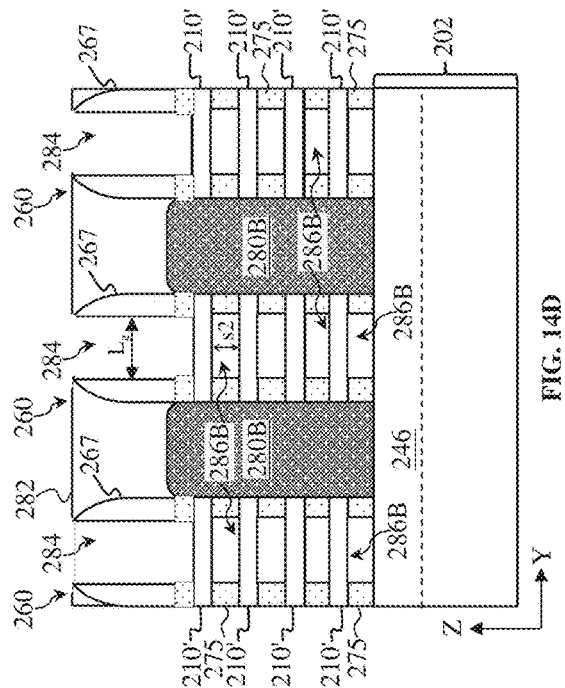
Figure 14D:
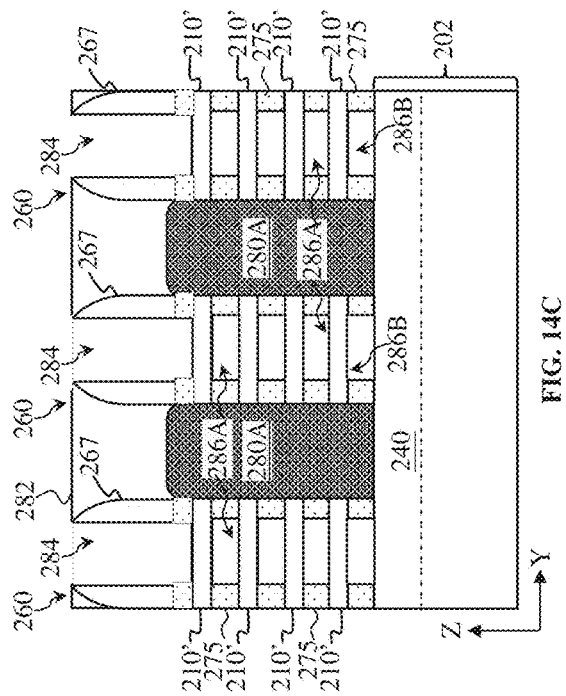

FIGS. 2A-17A, FIGS. 2B-17B, FIGS. 2C-17C, and FIGS. 2D-17D are fragmentary diagrammatic views of a multigate device 200, in portion or entirety, at various fabrication stages (such as those associated with method 100 in FIGS. 1A, 1B, 1C and 1D) according to various aspects of the present disclosure. In particular, FIGS. 2A-4A and 7A-17A are top views of multigate device 200 in an X-Y plane; FIGS. 2B-4B and 7B-17B are diagrammatic cross-sectional views of multigate device 200 in an X-Z plane along lines B-B' respectively of FIGS. 2A-4A and 7A-17A, FIGS. 2C-4C and 7C-17C are diagrammatic cross-sectional views of multigate device 200 in a Y-Z plane along lines C-C' respectively of FIGS. 2A-4A and 7A-17A; and FIGS. 2D-4D and 7D-17D are diagrammatic cross-sectional views of multigate device 200 in the Y-Z plane along lines D-D' respectively of FIGS. 2A-4A and 7A-17A. FIGS. 5A, 5B, 5C and 5D are diagrammatic cross-sectional views of multigate device 200 in an X-Z plane along lines B-B' of FIG. 4A at various fabrication stages, constructed in accordance with some embodiments. FIGS. 6A, 6B, 6C and 6D are diagrammatic cross-sectional views of multigate device 200 in an X-Z plane along lines B-B' of FIG. 4A at various fabrication stages, constructed in accordance with some other embodiments. Multigate device 200 may be included in a microprocessor, a memory, and/or other IC device. In some embodiments, multigate device 200 is a portion of an IC chip, a system on chip (SoC), or portion thereof, that includes various passive and active microelectronic devices such as resistors, capacitors, inductors, diodes, p-type field effect transistors (pFETs), n-type field effect transistors (nFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, multigate device 200 is included in a non-volatile memory, such as a non-volatile random-access memory (NVRAM), a flash memory, an electrically erasable programmable read only memory (EEPROM), an electrically programmable read-only memory (EPROM), other suitable memory type, or combinations thereof. FIGS. 2A-17A, FIGS. 2B-17B, FIGS. 2C-17C, and FIGS. 2D-17D have been simplified for the sake of clarity to better understand the inventive concepts of the present disclosure. Additional features can be added in multigate device 200, and some of the features described below can be replaced, modified, or eliminated in other embodiments of multigate device 200.

Turning to FIGS. 2A-2D, multigate device 200 includes a substrate (wafer) 202. In the depicted embodiment, substrate 202 includes silicon. Alternatively, or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions depending on design requirements of multigate device 200. In the depicted embodiment, substrate 202 includes a p-type doped region 203A (referred to hereinafter as a p-well), which can be configured for n-type GAA transistors, and an n-type doped region 203B (referred to hereinafter as an n-well), which can be configured for p-type GAA transistors. N-type doped regions, such as n-well 203B, are doped with n-type dopants, such as phosphorus, arsenic, other n-type dopant, or combinations thereof. P-type doped regions, such as p-well 203A, are doped with p-type dopants, such as boron, indium, other p-type dopant, or combinations thereof. In some implementations, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions. In some embodiments, the p-well structure 203A and the n-well structure 203B are formed by ion implantations. For example, a first patterned mask is formed, by deposition and a lithography process, with a first opening corresponding to the area for the p-well 203A; a first ion implantation process is applied to introduce the p-type dopant into the substrate 202 through the first opening; the first patterned mask is removed thereafter; a second patterned mask is formed with a second opening corresponding to the area for the n-well 203B; a second ion implantation process is applied to introduce the n-type dopant into the substrate 202 through the second opening; and the second patterned mask is removed thereafter.

A diffusion blocking layer (DBL) 204 is formed over substrate 202, where DBL 204 is designed with composition and thickness to effectively block the diffusion of the dopant during the steps to form an anti-punch-through (APT) feature at later stages. In some embodiments, the DBL 204 is a semiconductor layer. In the depicted embodiment, the DBL 204 is a silicon germanium (SiGe) layer. SiGe can block the diffusion of boron, with proper germanium concentration and enough thickness. For example, SiGe is epitaxially grown on substrate 202 to form DBL 204. In some embodiments, epitaxial growth of DBL 204 is achieved by a molecular beam epitaxy (MBE) process, a chemical vapor deposition (CVD) process, a metalorganic chemical vapor deposition (MOCVD) process, other suitable epitaxial growth process, or combinations thereof.

A semiconductor layer stack 205 is formed over DBL 204, where semiconductor layer stack 205 includes semiconductor layers 210 and semiconductor layers 215 stacked vertically (e.g., along the z-direction) in an interleaving or alternating configuration from a surface of substrate 202. In some embodiments, semiconductor layers 210 and semiconductor layers 215 are epitaxially grown in the depicted interleaving and alternating configuration. For example, a first one of semiconductor layers 210 is epitaxially grown on substrate, a first one of semiconductor layers 215 is epitaxially grown on the first one of semiconductor layers 215, a second one of semiconductor layers 210 is epitaxially grown on the first one of semiconductor layers 215, and so on until semiconductor layers stack 205 has a desired number of semiconductor layers 210 and semiconductor layers 215. In such embodiments, semiconductor layers 210 and semiconductor layers 215 can be referred to as epitaxial layers. In some embodiments, epitaxial growth of semiconductor layers 210 and semiconductor layers 215 is achieved by a MBE process, a CVD process, a MOCVD process, other suitable epitaxial growth process, or combinations thereof.

A composition of semiconductor layers 210 is different than a composition of semiconductor layers 215 to achieve etching selectivity and/or different oxidation rates during subsequent processing. In some embodiments, semiconductor layers 210 have a first etch rate to an etchant and semiconductor layers 215 have a second etch rate to the etchant, where the second etch rate is less than the first etch rate. In some embodiments, semiconductor layers 210 have a first oxidation rate and semiconductor layers 215 have a second oxidation rate, where the second oxidation rate is less than the first oxidation rate. In the depicted embodiment, semiconductor layers 210 and semiconductor layers 215 include different materials, constituent atomic percentages, constituent weight percentages, thicknesses, and/or characteristics to achieve desired etching selectivity during an etching process, such as an etching process implemented to form suspended channel layers in channel regions of multigate device 200. For example, where semiconductor layers 210 include silicon and semiconductor layers 215 include silicon germanium, a silicon etch rate of semiconductor layers 210 is less than a silicon germanium etch rate of semiconductor layers 215. In some embodiments, semiconductor layers 210 and semiconductor layers 215 can include the same material but with different constituent atomic percentages to achieve the etching selectivity and/or different oxidation rates. For example, semiconductor layers 210 and semiconductor layers 215 can include silicon germanium, where semiconductor layers 210 have a first silicon atomic percent and/or a first germanium atomic percent and semiconductor layers 215 have a second, different silicon atomic percent and/or a second, different germanium atomic percent. The present disclosure contemplates that semiconductor layers 210 and semiconductor layers 215 include any combination of semiconductor materials that can provide desired etching selectivity, desired oxidation rate differences, and/or desired performance characteristics (e.g., materials that maximize current flow), including any of the semiconductor materials disclosed herein.

As described further below, semiconductor layers 210 or portions thereof form channel regions of multigate device 200. In the depicted embodiment, semiconductor layer stack 205 includes four semiconductor layers 210 and four semiconductor layers 215 configured to form semiconductor layer stack disposed over DBL 204. After undergoing subsequent processing, such configuration will result in multigate device 200 having four channels. However, the present disclosure contemplates embodiments where semiconductor layer stack 205 includes more or less semiconductor layers, for example, depending on a number of channels desired for multigate device 200 (e.g., a GAA transistor) and/or design requirements of multigate device 200. For example, semiconductor layer stack 205 can include two to ten semiconductor layers 210 and two to ten semiconductor layers 215. In furtherance of the depicted embodiment, semiconductor layers 210 have a thickness t1 and semiconductor layers 215 have a thickness t2, where thickness t1 and thickness t2 are chosen based on fabrication and/or device performance considerations for multigate device 200. For example, thickness t2 can be configured to define a desired distance (or gap) between adjacent channels of multigate device 200 (e.g., between semiconductor layers 210), thickness t1 can be configured to achieve desired thickness of channels of multigate device 200, and both thickness t1 and thickness t2 can be configured to achieve desired performance of multigate device 200. In some embodiments, thickness t1 and thickness t2 are about 2 nm to about 12 nm. In some embodiments, thickness t1 is about 9 nm to about 11 nm, and thickness t2 is about 5 nm to about 7 nm. In some embodiments, the second semiconductor layers 215 has a germanium concentration less than 25% (atom percentage).

DBL 204 is different from the semiconductor materials of semiconductor layer stack 205, especially different from each of first semiconductor layers 210 and the second semiconductor layers 215 in composition and thickness due to respective functions, as described above. For examples, wherein first semiconductor layers 210 include silicon and second semiconductor layers 215 include silicon germanium, DBL 204 includes silicon germanium but with different germanium concentration, thickness or both to be effective for blocking diffusion. Particularly, DBL 204 has a germanium concentration greater than that of second semiconductor layers 215 and may further have a thickness greater than each of second semiconductor layers 215. In some examples, DBL 204 has a germanium concentration ranging between about 25% (atom percentage) and about 50%, and further has a thickness t3 ranging between about 10 nm and about 15 nm. In some examples, DBL 204 has a germanium concentration greater than 25% and has a thickness t3 greater than 8 nm.

Turning to FIGS. 3A-3D, semiconductor layer stack 205 is patterned to form a fin 218A and a fin 218B (also referred to as fin structures, fin elements, etc.). DBL 204 is patterned with the semiconductor layer stack 205 as well. Fins 218, 218B include a substrate portion (i.e., a portion of substrate 202), a DBL portion (i.e., a portion of DBL 204), and a semiconductor layer stack portion (i.e., a remaining portion of semiconductor layer stack 205 including semiconductor layers 210 and semiconductor layers 215). Fins 218A, 218B extend substantially parallel to one another along a y-direction, having a length defined in the y-direction, a width defined in an x-direction, and a height defined in a z-direction. In some implementations, a lithography and/or etching process is performed to pattern semiconductor layer stack 205 to form fins 218A, 218B. The lithography process can include forming a resist layer over semiconductor layer stack 205 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process removes portions of semiconductor layer stack 205 using the patterned resist layer as an etch mask. In some embodiments, the patterned resist layer is formed over a hard mask layer disposed over semiconductor layer stack 205, a first etching process removes portions of the hard mask layer to form a patterned hard mask layer, and a second etching process removes portions of semiconductor layer stack 205 using the patterned hard mask layer as an etch mask. The etching process can include a dry etching process, a wet etching process, other suitable etching process, or combinations thereof. In some embodiments, the etching process is a reactive ion etching (RIE) process. After the etching process, the patterned resist layer (and, in some embodiments, a hard mask layer) may be removed, for example, by a resist stripping process or other suitable process. Alternatively, fins 218A, 218B are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some embodiments, directed self-assembly (DSA) techniques are implemented while patterning semiconductor layer stack 205. Further, in some embodiments, the exposure process can implement maskless lithography, electron-beam (e-beam) writing, and/or ion-beam writing for patterning the resist layer.

An isolation feature(s) 230 including a solid doping source material layer is formed over and/or in substrate 202 to isolate various regions, such as various device regions, of multigate device 200. For example, isolation features 230 surround a bottom portion of fins 218A, 218B, such that isolation features 230 separate and isolate fins 218A, 218B from each other. In the depicted embodiment, isolation features 230 surround the substrate portion of fins 218A, 218B (e.g., doped regions 203A, 203B of substrate 202) and partially surround the semiconductor layer stack portion of fins 218A, 218B (e.g., a portion of bottommost semiconductor layer 210). However, the present disclosure contemplates different configurations of isolation features 230 relative to fins 218A, 218B. Isolation features 230 include silicon oxide, silicon nitride, silicon oxynitride, other suitable isolation material (for example, including silicon, oxygen, nitrogen, carbon, or other suitable isolation constituent), or combinations thereof. Isolation features 230 can include different structures, such as shallow trench isolation (STI) structures, or deep trench isolation (DTI) structures. For example, isolation features 230 can include STI features that define and electrically isolate fins 218A, 218B from other active device regions (such as fins) and/or passive device regions. STI features can be formed by etching a trench in substrate 202 with fin active regions defined thereby (as described above, for example, by using a dry etching process and/or a wet etching process) and filling the trench with insulator material (for example, by using a CVD process or a spin-on glass process). A chemical mechanical polishing (CMP) process may be performed to remove excessive insulator material and/or planarize a top surface of isolation features 230. Then an etch-back process is applied to selectively etch the insulator material layer to form isolation features 230. In some embodiments, STI features include a multi-layer structure that fills the trenches, such as a silicon nitride comprising layer disposed over a thermal oxide comprising liner layer. In another example, STI features include a dielectric layer disposed over a doped liner layer (including, for example, boron silicate glass (BSG) or phosphosilicate glass (PSG)). In yet another example, STI features include a bulk dielectric layer disposed over a liner dielectric layer, where the bulk dielectric layer and the liner dielectric layer include materials depending on design requirements. Particularly, isolation features 230 includes a solid doping source material layer functioning as a source to diffuse the dopant into the fin active regions to form APT features therein. Isolation features 230 surrounding the fin active regions 218A and 218B may be different in composition and structure due to different requirements for the solid doping source materials. Therefore, isolation features surrounding the fin active region 218A and 218B may be formed separately and are referred to as isolation features 230A and 230B, respectively, as illustrated in FIGS. 4A-4D. The method to form the isolation features 230A and 230B are further described in detail according to various embodiments.

Referring to FIGS. 5A-5D and 1B, the operation 110 to form the isolation features 230 and the operation 112 to drive the dopants into the fin active regions to form APT features are collectively described according to some embodiments. The isolation feature 230A is formed in the regions having P-well 203A and nFETs to be formed, as illustrated in FIG. 5A. The isolation feature 230A includes a liner 232, a solid doping source material layer 234, and a filling dielectric material layer 236. In the depicted embodiments, the liner 232 includes an oxide material, such as silicon oxide, formed by deposition, thermal oxidation, or other suitable method. The liner 232 has a thickness ranging between 2 nm and 5 nm, in some examples. The solid doping source material layer 234 is a dielectric material containing the desired dopant, such as boron. In the depicted embodiments, the solid doping source material layer 234 includes borosilicate glass (BSG) formed by deposition, such as CVD or other suitable method. The solid doping source material layer 234 has a boron concentration greater enough to effectively form the APT feature at subsequent stages. In some embodiments, the solid doping source material layer 234 has a boron concentration ranging between $1\times10^{21}$ atoms/cm$^3$~$1\times10^{22}$ atoms/cm$^3$. The solid doping source material layer 234 has a thickness ranging between 5 nm and 50 nm. The filling dielectric material layer 236 includes a dielectric material, such as silicon oxide, low-k dielectric material, other suitable dielectric material or a combination thereof. The filling dielectric material layer 236 is formed by deposition, such as CVD, flowable CVD (FCVD), other suitable method, or a combination thereof. After the formation of the liner 232, the solid doping source material layer 234 and the filling dielectric material layer 236, a CMP process is applied to remove those materials deposited on top of the fin active regions and planarize the top surface, thereby forming the isolation feature 230A. Thereafter, a selective etching process is applied to those materials (232~236) to recess the isolation feature 230A by any suitable etching process, such as dry etching, wet etching, or a combination thereof.

As noted above, the isolation feature 230A is used as solid diffusion source to form desired APT feature. APT features for nFETs and pFETs are doped oppositely and the solid doping source material layers are differently. In the depicted embodiments, the trenches associated with the N-well 203B and the fin active region 218B are covered by a patterned mask 238 formed by a lithography process, etching or both. The patterned mask 238 may be a soft mask, such as photoresist material, formed by a lithography process, or alternatively a hard mask, such as silicon oxide and a silicon nitride, formed by a lithography process and etching.

Referring to FIG. 5B, a driving process is applied to drive the dopant (boron in the present example) to the fin active region 218A, thereby forming an APT feature 240. In the depicted embodiment, the driving process is a thermal annealing process with a thermal annealing temperature and annealing duration designed to effectively drive the dopant into the fin active region 218A for the desired doping concentration. In some examples, the thermal annealing process includes an annealing temperature greater than 900° C. In some embodiments, the thermal annealing process includes an annealing temperature ranging between 1000° C. and 1100° C., an annealing duration ranging between 5 seconds and 30 seconds or spike annealing with a few milliseconds, and an annealing environment having chemical: nitrogen, oxygen, hydrogen or a combination thereof. In some examples, the thermal annealing process may be implemented in a rapid thermal annealing apparatus.

Such formed APT features 240 is a p-type doped feature configured below the DBL 204 and constrained by the DBL 204 from diffusing into the channels. The APT features 240 has a thickness determined by the dopant concentration of the solid doping source material layer 234 and the thermal annealing process (including annealing temperature and annealing duration). In some examples, the APT feature 240 is formed to have a thickness greater than 100 nm, such as within a range of about 200-500 nanometers. In one example, the concentration of the p-type dopant for the APT features 240 is within a range of about $5\times10^{17}$/cm$^3$~$5\times10^{19}$/cm$^3$. The dopant concentration of the APT features 240 is greater than that of the channel layer that is to be formed at a later stage. The patterned mask 238 is removed thereafter.

Referring to FIG. 5C, the isolation feature 230B is formed in the trenches associated with the N-well 203B and the fin active region 218B with a similar or different procedure. The regions associated with the P-well 203A and the fin active region 218A may be covered by a patterned mask 242 that is formed by a lithography process, etching or both. The patterned mask 242 may be a soft mask formed by a lithography process, or alternatively a hard mask formed by a lithography process and etching.

In some embodiments, the isolation feature 230B includes a liner 232, a solid doping source material layer 244, and a filling dielectric material layer 236. In the depicted embodiments, the liner 232 and the filling dielectric material layer 236 are similar to those in the isolation feature 230A in term of composition. The solid doping source material layer 244 is different from the solid doping source material layer 234 and includes an opposite dopant, such as phosphorous. The solid doping source material layer 244 is a dielectric material containing the desired dopant, such as phosphorous. In the depicted embodiments, the solid doping source material layer 244 includes phosphosilicate glass (PSG) formed by deposition, such as CVD or other suitable method. The solid doping source material layer 244 has a phosphorous concentration greater enough to effectively form the corresponding APT feature at subsequent stages. In some embodiments, the solid doping source material layer 244 has a phosphorous concentration greater than 15% (atomic percentage), such as ranging between 15% and 30%. The solid doping source material layer 244 has a thickness ranging between 5 nm and 50 nm.

After the formation of the liner 232, the solid doping source material layer 244 and the filling dielectric material layer 236, a CMP process is applied to remove those materials deposited on top of the fin active regions and planarize the top surface, thereby forming the isolation feature 230B. Thereafter, a selective etching process is applied to those materials (232, 244 and 236) to recess the isolation feature 230B by any suitable etching process, such as dry etching, wet etching, or a combination thereof.

Referring to FIG. 5D, a driving process is applied to drive the dopant (phosphorous in the present example) to the fin active region 218B, thereby forming an APT feature 246. The APT feature 246 is an n-type doped feature positioned under the DBL 204. In the depicted embodiment, the driving process is a thermal annealing process with a thermal annealing temperature and annealing duration designed to effectively drive the dopant into the fin active region 218B. The patterned mask 242 is removed thereafter In some embodiments, the DBL 204 to form the APT feature 246 may be designed differently to effectively block the diffusion of the dopant phosphorous. For example, the DBL 204 associated with the n-well 203B may have composition, concentration, thickness, structure, or a combination thereof, designed different from the DBL 204 associated with the p-well 203A. For example, the DBL 204 associated with the n-well 203B may include silicon carbide, gallium arsenide, other suitable composition or a combination thereof. In this case, the DBL 204 are separately formed in the p-well regions and n-well regions. For example, the n-well regions are covered by a patterned mask (may use the same patterned mask to form the p-wells), and then the DBL of SiGe is epitaxially grown in the p-well regions. Thereafter or therebefore, the p-well regions are covered by a patterned mask (may use the same patterned mask to form the n-wells), and then the DBL of different composition (such as silicon carbide or gallium arsenide) is epitaxially grown in the n-well regions.

In some embodiments, the isolation feature 230B includes no solid diffusion source and the corresponding APT feature is formed by other method, such as ion implantation or tilted ion implantation through the sidewalls of the trenches. In some embodiments, various processes above may be implemented in different sequence. For example, the patterned mask (such as 238 or 242) may be removed before the driving process to form corresponding APT features (such as 240 or 246) by the operation 112. In some embodiments, the formations of APT features 240 and 246 are implemented in different sequence, such as the APT feature 246 is formed and thereafter the APT feature 240 is formed.

Referring to FIGS. 6A-6D and 1C, the operation 110 to form the isolation features 230 and the operation 112 to drive the dopants into the fin active regions to form APT features are collectively described according to some other embodiments. The isolation feature 230A includes a solid doping source material layer 234 but positioned on top portion of the isolation feature 230A. Similarly, the isolation feature 230B includes a solid doping source material layer 244 but positioned on top portion of the isolation feature 230B.

The isolation feature 230A is formed in the regions associated with P-well 203A and nFETs, as illustrated in FIG. 6A. The isolation feature 230A includes a liner 232, a filling dielectric material layer 236, and a solid doping source material layer 234. The liner 232 and the filling dielectric material layer 236 may be same or similar to the corresponding material layers in FIG. 5A in terms of composition and formation. For example, the liner 232 includes an oxide material, such as silicon oxide, formed by deposition, thermal oxidation, or other suitable method. The filling dielectric material layer 236 is directly formed on the liner 232, and may include a dielectric material, such as silicon oxide, low-k dielectric material, other suitable dielectric material or a combination thereof, formed by deposition, such as CVD, FCVD, other suitable method, or a combination thereof. After the formation of the liner 232 and the filling dielectric material layer 236, a CMP process is applied to remove those materials deposited on top of the fin active regions and planarize the top surface, thereby forming the isolation feature 230A. Thereafter, a selective etching process is applied to those materials (232 and 236) to recess the isolation feature 230A by any suitable etching process, such as dry etching, wet etching, or a combination thereof.

Thereafter, the solid doping source material layer 234 is formed on the recessed filling dielectric material layer 236 by a suitable method, such as CVD. A subsequent etching process may be applied to the solid doping source material layer 234 such that the solid doping source material layer 234 disposed on the sidewalls of the fin active region 218A is removed and the solid doping source material layer 234 is below the DBL 204. Thus, the subsequent diffusion can be blocked and constrained by the DBL 204. The solid doping source material layer 234 is a dielectric material containing the desired dopant, such as boron. In the depicted embodiments, the solid doping source material layer 234 includes formed by deposition, such as CVD or other suitable method. The solid doping source material layer 234 has a boron concentration greater enough to effectively form the APT feature at subsequent stages. In some embodiments, the solid doping source material layer 234 has a boron concentration greater than 15% (atomic percentage), such as ranging between 15% and 30%. The solid doping source material layer 234 has a thickness ranging between 5 nm and 50 nm.

As noted above, the isolation feature 230A is used as solid diffusion source to form desired APT feature. APT features for nFETs and pFETs are doped oppositely and the solid doping source material layers are differently. In the depicted embodiments, the trenches associated with the N-well 203B and the fin active region 218B are covered by a patterned mask 238 formed by a lithography process, etching or both. The patterned mask 238 may be a soft mask, such as photoresist material, formed by a lithography process, or alternatively a hard mask, such as silicon oxide and a silicon nitride, formed by a lithography process and etching.

Referring to FIG. 6B, a driving process is applied to drive the dopant (boron in the present example) to the fin active region 218A, thereby forming an APT feature 240. The driving process is a thermal annealing process with a thermal annealing temperature and annealing duration designed to effectively drive the dopant into the fin active region 218A. In the depicted embodiment, the driving process is similar to the corresponding driving in FIG. 5B.

Such formed APT features 240 is a p-type doped feature configured below the DBL 204 and constrained by the DBL 204 from diffusing into the channels. The APT features 240 has a thickness determined by the dopant concentration of the solid doping source material layer 234 and the thermal annealing process (including annealing temperature and annealing duration). In some examples, the APT feature 240 is formed to have a thickness greater than 100 nm, such as within a range of about 200-500 nanometers. In one example, the concentration of the p-type dopant for the APT features 240 is within a range of about $1\times10^{17}/cm^3$-$1\times10^{18}/cm^3$. The dopant concentration of the APT features 240 is greater than that of the channel layer that is to be formed at a later stage. The patterned mask 238 is removed thereafter.

Referring to FIG. 6C, the isolation feature 230B is formed in the trenches associated with the N-well 203B and the fin active region 218B with a similar or different procedure. The regions associated with the P-well 203A and the fin active region 218A may be covered by a patterned mask 242 that is formed by a lithography process, etching or both. The patterned mask 242 may be a soft mask formed by a lithography process, or alternatively a hard mask formed by a lithography process and etching.

In some embodiments, the isolation feature 230B includes a liner 232, a filling dielectric material layer 236, and a solid doping source material layer 244. In the depicted embodiments, the liner 232 and the filling dielectric material layer 236 are similar to those in the isolation feature 230A in term of composition. The solid doping source material layer 244 is positioned to top portion of the isolation feature 230B. The solid doping source material layer 244 is different from the solid doping source material layer 234 and includes an opposite dopant, such as phosphorous. The solid doping source material layer 244 is a dielectric material containing the desired dopant, such as phosphorous. In the depicted embodiments, the solid doping source material layer 244 includes PSG formed by deposition, such as CVD or other suitable method. The solid doping source material layer 244 has a phosphorous concentration greater enough to effectively form the corresponding APT feature at subsequent stages. In some embodiments, the solid doping source material layer 244 similar to the solid doping source material layer 244 in FIG. 5C. For example, the solid doping source material layer 244 has a phosphorous concentration greater than 15%, such as ranging between 15% and 30%. The solid doping source material layer 244 has a thickness ranging between 5 nm and 50 nm.

After the formation of the liner 232 and the filling dielectric material layer 236, a CMP process is applied to remove those materials deposited on top of the fin active regions and planarize the top surface, thereby forming the isolation feature 230B. Thereafter, a selective etching process is applied to those materials (232 and 236) to recess the isolation feature 230B by any suitable etching process, such as dry etching, wet etching, or a combination thereof.

Thereafter, the solid doping source material layer 244 is deposited on the filling dielectric material layer 236, such as by CVD or other suitable deposition method. A subsequent etching process may be applied to the solid doping source material layer 244 such that the solid doping source material layer 244 disposed on the sidewalls of the fin active region 218A is removed and the solid doping source material layer 234 is below the DBL 204. Thus, the subsequent diffusion can be blocked and constrained by the DBL 204.

Referring to FIG. 6D, a driving process is applied to drive the dopant (phosphorous in the present example) to the fin active region 218B, thereby forming an APT feature 246. The APT feature 246 is an n-type doped feature positioned under the DBL 204. In the depicted embodiment, the driving process is a thermal annealing process with a thermal annealing temperature and annealing duration designed to effectively drive the dopant into the fin active region 218B. The patterned mask 242 is removed thereafter.

In some embodiments, the DBL 204 to form the APT feature 246 may be designed differently to effectively block the diffusion of the dopant phosphorous. For example, the DBL 204 associated with the n-well 203B may have composition, concentration, thickness, structure, or a combination thereof, designed different from the DBL 204 associated with the p-well 203A. For example, the DBL 204 associated with the n-well 203B may include silicon carbide, gallium arsenide, other suitable composition or a combination thereof. In this case, the DBL 204 are separately formed in the p-well regions and n-well regions. For example, the n-well regions are covered by a patterned mask (may use the same patterned mask to form the p-wells), and then the DBL of SiGe is epitaxially grown in the p-well regions. Thereafter or therebefore, the p-well regions are covered by a patterned mask (may use the same patterned mask to form the n-wells), and then the DBL of different composition (such as silicon carbide or gallium arsenide) is epitaxially grown in the n-well regions.

Turning to FIGS. 7A-7D, a cladding layer 250 may be formed on sidewalls of the fin active regions (such as 218A and 218B). In FIGS. 7A-7D, the isolation features 230A and 230B, and the APT features 240 and 246 are presented differently for better viewing other features and components. The cladding layer 250 may include silicon germanium formed by CVD, other suitable deposition method or a combination thereof, according to some embodiments. The cladding layer 250 may provide a path to subsequent etch for channel release.

Referring to FIGS. 8A-8D, gate structures 260 are formed over portions of fins 218A, 218B and over isolation features 230. Gate structures 260 extend lengthwise in a direction that is different than (e.g., orthogonal to) the lengthwise direction of fins 218A, 218B. For example, gate structures 260 extend substantially parallel to one another along the x-direction, having a length defined in the y-direction, a width defined in the x-direction, and a height defined in the z-direction. Gate structures 260 are disposed on portions of fins 218A, 218B and define source/drain regions 262 and channel regions 264 of fins 218A, 218B. In the X-Z plane, gate structures 260 wrap top surfaces and sidewall surfaces of fins 218A, 218B. In the Y-Z plane, gate structures 260 are disposed over top surfaces of respective channel regions 264 of fins 218A, 218B, such that gate structures 260 interpose respective source/drain regions 262. Each gate structure 260 includes a gate region 260-1 that corresponds with a portion of the respective gate structure 260 that will be configured for an n-type GAA transistor (and thus corresponds with a portion spanning an n-type GAA transistor region) and a gate region 260-2 that corresponds with a portion of the respective gate structure 260 that will be configured for a p-type GAA transistor (and thus corresponds with a portion spanning a p-type GAA transistor region). Gate structures 260 are configured differently in gate region 260-1 and gate region 260-2. For example, as described further below, each metal gate stack of gate structures 260 spans gate region 260-1 and gate region 260-2 and is configured differently in gate region 260-1 and gate region 260-2 to optimize performance of the n-type GAA transistors (having n-gate electrodes in gate regions 260-1) and the p-type GAA transistors (having p-gate electrodes in gate regions 260-2). Accordingly, gate regions 260-1 will be referred to as n-type gate regions 260-1 and gate regions 260-2 will be referred to as p-type gate regions 260-2 hereinafter.

In FIGS. 8A-8D, each gate structure 260 includes a dummy gate stack 265. In the depicted embodiment, a width of dummy gate stacks 265 defines a gate length ($L_g$) of gate structures 260 (here, in the y-direction), where the gate length defines a distance (or length) that current (e.g., carriers, such as electrons or holes) travels between source/drain regions 262 when the n-type GAA transistor and/or the p-type GAA transistor are switched (turned) on. In some embodiments, the gate length is about 5 nm to about 250 nm. Gate length can be tuned to achieve desired operation speeds of the GAA transistors and/or desired packing density of the GAA transistors. For example, when a GAA transistor is switched on, current flows between source/drain regions of the GAA transistor. Increasing the gate length increases a distance required for current to travel between the source/drain regions, increasing a time it takes for the GAA transistor to switch fully on. Conversely, decreasing the gate length decreases the distance required for current to travel between the source/drain regions, decreasing a time it takes for the GAA transistor to switch fully on. Smaller gate lengths provide GAA transistors that switch on/off more quickly, facilitating faster, high speed operations. Smaller gate lengths also facilitate tighter packing density (i.e., more GAA transistors can be fabricated in a given area of an IC chip), increasing a number of functions and applications that can be fabricated on the IC chip. In the depicted embodiment, the gate length of one or more of gate structures 260 is configured to provide GAA transistors having short-length (SC) channels. For example, the gate length of SC GAA transistors is about 5 nm to about 20 nm. In some embodiments, multigate device 200 can include GAA transistors having different gate lengths. For example, a gate length of one or more of gate structures 260 can be configured to provide GAA transistors having mid-length or long-length channels (M/LC). In some embodiments, the gate length of M/LC GAA transistors is about 20 nm to about 250 nm.

Dummy gate stacks 265 include a dummy gate electrode, and in some embodiments, a dummy gate dielectric. The dummy gate electrode includes a suitable dummy gate material, such as polysilicon layer. In embodiments where dummy gate stacks 265 include a dummy gate dielectric disposed between the dummy gate electrode and fins 218A, 218B, the dummy gate dielectric includes a dielectric material, such as silicon oxide, a high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. In some embodiments, the dummy gate dielectric includes an interfacial layer (including, for example, silicon oxide) disposed over fins 218A, 218B and a high-k dielectric layer disposed over the interfacial layer. Dummy gate stacks 265 can include numerous other layers, for example, capping layers, interface layers, diffusion layers, barrier layers, hard mask layers, or combinations thereof. For example, dummy gate stacks 265 can further include a hard mask layer disposed over the dummy gate electrode.

Dummy gate stacks 265 are formed by deposition processes, lithography processes, etching processes, other suitable processes, or combinations thereof. For example, a deposition process is performed to form a dummy gate electrode layer over fins 218A, 218B and isolation features 230 (such as 230A and 230B). In some embodiments, a deposition process is performed to form a dummy gate dielectric layer over fins 218A, 218B and isolation features 230 before forming the dummy gate electrode layer. In such embodiments, the dummy gate electrode layer is deposited over the dummy gate dielectric layer. In some embodiment, a hard mask layer is deposited over the dummy gate electrode layer. The deposition process includes CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. A lithography patterning and etching process is then performed to pattern the dummy gate electrode layer (and, in some embodiments, the dummy gate dielectric layer and the hard mask layer) to form dummy gate stacks 265, such that dummy gate stacks 265 (including the dummy gate electrode layer, the dummy gate dielectric layer, the hard mask layer, and/or other suitable layers) is configured as depicted in FIGS. 8A-8D. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching methods, or combinations thereof.

Each gate structure 260 further includes gate spacers 267 disposed adjacent to (i.e., along sidewalls of) respective dummy gate stacks 245. Gate spacers 247 are formed by any suitable process and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen, such as a silicon nitride layer, can be deposited over dummy gate stacks 265 and subsequently etched (e.g., anisotropically etched) to form gate spacers 267. In some embodiments, gate spacers 267 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to dummy gate stacks 265. In such implementations, the various sets of spacers can include materials having different etch rates. For example, a first dielectric layer including silicon and oxygen (e.g., silicon oxide) can be deposited and etched to form a first spacer set adjacent to dummy gate stacks 265, and a second dielectric layer including silicon and nitrogen (e.g., silicon nitride) can be deposited and etched to form a second spacer set adjacent to the first spacer set.

Turning to FIGS. 9A-9D, exposed portions of fins 218A, 218B (i.e., source/drain regions 262 of fins 218A, 218B that are not covered by gate structures 260) are at least partially removed to form source/drain trenches (recesses) 270. In the depicted embodiment, an etching process completely removes semiconductor layer stack 205 and the DBL 204 in source/drain regions 262 of fins 218A, 218B, thereby exposing the substrate portion of fins 218A, 218B in source/drain regions 262 (e.g., p-well 203A and n-well 203B). Source/drain trenches 270 thus have sidewalls defined by remaining portions of semiconductor layer stack 205, which are disposed in channel regions 264 under gate structures 260, and bottoms defined by substrate 202, such as top surfaces of APT features 240 in p-well 203A and APT feature 246 in n-well 203B in source/drain regions 262. In some embodiments, the etching process removes some, but not all, of semiconductor layer stack 205, such that source/drain trenches 270 have bottoms defined by semiconductor layer 210 or semiconductor layer 215 in source/drain regions 262. In some embodiments, the etching process further removes some, but not all, of the substrate portion of fins 218A, 218B, such that source/drain recesses 270 extend below a topmost surface of substrate 202. The etching process can include a dry etching process, a wet etching process, other suitable etching process, or combinations thereof. In some embodiments, the etching process is a multi-step etch process. For example, the etching process may alternate etchants to separately and alternately remove semiconductor layers 210 and semiconductor layers 215. In some embodiments, parameters of the etching process are configured to selectively etch semiconductor layer stack with minimal (to no) etching of gate structures 260 (i.e., dummy gate stacks 265 and gate spacers 267) and/or isolation features 230. In some embodiments, a lithography process, such as those described herein, is performed to form a patterned mask layer that covers gate structures 260 and/or isolation features 230, and the etching process uses the patterned mask layer as an etch mask.

Turning to FIGS. 10A-10D, inner spacers 267 are formed in channel regions 264 along sidewalls of semiconductor layers 210 by any suitable process. For example, a first etching process is performed that selectively etches semiconductor layers 215 exposed by source/drain trenches 270 with minimal (to no) etching of semiconductor layers 210, such that gaps are formed between semiconductor layers 210 and between semiconductor layers 210 and substrate 202 under gate spacers 267. Portions (edges) of semiconductor layers 210 are thus suspended in the channel regions 264 under gate spacers 267. In some embodiments, the gaps extend partially under dummy gate stacks 265. The first etching process is configured to laterally etch (e.g., along the y-direction) semiconductor layers 215, thereby reducing a length of semiconductor layers 215 along the y-direction. The first etching process is a dry etching process, a wet etching process, other suitable etching process, or combinations thereof. A deposition process then forms a spacer layer over gate structures 260 and over features defining source/drain trenches 270 (e.g., semiconductor layers 215, semiconductor layers 210, DBL 204 and substrate 202), such as CVD, PVD, ALD, HDPCVD, MOCVD, RPCVD, PECVD, LPCVD, ALCVD, APCVD, other suitable methods, or combinations thereof. The spacer layer partially (and, in some embodiments, completely) fills the source/drain trenches 270. The deposition process is configured to ensure that the spacer layer fills the gaps between semiconductor layers 210 and between semiconductor layers 210 and substrate 202 under gate spacers 267. A second etching process is then performed that selectively etches the spacer layer to form inner spacers 275 as depicted in FIGS. 10A-10D with minimal (to no) etching of semiconductor layers 210, dummy gate stacks 265, and gate spacers 267. In the depicted embodiment, the second etching process is an anisotropic etching process, such as plasma etch, to remove portions of the spacer layer in the trenches 270. In some embodiments, the spacer layer is removed from sidewalls of gate spacers 267, sidewalls of semiconductor layers 210, dummy gate stacks 265, and substrate 202. The spacer layer (and thus inner spacers 275) includes a material that is different than a material of semiconductor layers 215 and a material of gate spacers 247 to achieve desired etching selectivity during the second etching process, and also provides isolation and separation between metal gate and source/drain features. In present embodiment, the spacer layer includes a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, dopants (for example, p-type dopants, n-type dopants, or combinations thereof) are introduced into the dielectric material, such that spacer layer includes a doped dielectric material.

Turning to FIGS. 11A-11D, epitaxial source/drain features are formed in source/drain recesses 250. In these figures, isolation features 230A and 230B are collectively labeled as 230 for simplicity. As described above, isolation features may include isolation features 230A and 230B with different compositions in the depicted embodiments. A semiconductor material is epitaxially grown from portions of substrate 202 and semiconductor layers 210 exposed by source/drain recesses 270, forming epitaxial source/drain features 280A in source/drain regions 262 that correspond with n-type GAA transistor regions and epitaxial source/drain features 280B in source/drain regions 262 that correspond with p-type GAA transistor regions. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of substrate 202 and/or semiconductor layer stack 205 (in particular, semiconductor layers 210). Epitaxial source/drain features 280A, 280B are doped with n-type dopants and/or p-type dopants. In some embodiments, for the n-type GAA transistors, epitaxial source/drain features 280A include silicon. Epitaxial source/drain features 280A can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for the p-type GAA transistors, epitaxial source/drain features 280B include silicon germanium or germanium. Epitaxial source/drain features 280B can be doped with boron, other p-type dopant, or combinations thereof (for example, forming Si:Ge:B epitaxial source/drain features). In some embodiments, epitaxial source/drain features 280A and/or epitaxial source/drain features 280B include more than one epitaxial semiconductor layer, where the epitaxial semiconductor layers can include the same or different materials and/or dopant concentrations. In some embodiments, epitaxial source/drain features 280A, 280B include materials and/or dopants that achieve desired tensile stress and/or compressive stress in respective channel regions 264. In some embodiments, epitaxial source/drain features 280A, 280B are doped during deposition by adding impurities to a source material of the epitaxy process (i.e., in-situ). In some embodiments, epitaxial source/drain features 280A, 280B are doped by an ion implantation process subsequent to a deposition process. In some embodiments, annealing processes (e.g., rapid thermal annealing (RTA) and/or laser annealing) are performed to activate dopants in epitaxial source/drain features 280A, 280B and/or other source/drain regions (for example, heavily doped source/drain regions and/or lightly doped source/drain (LDD) regions). In some embodiments, epitaxial source/drain features 280A, 280B are formed in separate processing sequences that include, for example, masking p-type GAA transistor regions when forming epitaxial source/drain features 280A in n-type GAA transistor regions and masking n-type GAA transistor regions when forming epitaxial source/drain features 260B in p-type GAA transistor regions.

Turning to FIGS. 12A-12D, an inter-level dielectric (ILD) layer 282 is formed over isolation features 230 (230A and 230B), epitaxial source/drain features 280A, 280B, and gate spacers 267, for example, by a deposition process (such as CVD, PVD, ALD, HDPCVD, MOCVD, RPCVD, PECVD, LPCVD, ALCVD, APCVD, plating, other suitable methods, or combinations thereof). ILD layer 282 is disposed between adjacent gate structures 260. In some embodiments, ILD layer 282 is formed by a flowable CVD (FCVD) process that includes, for example, depositing a flowable material (such as a liquid compound) over multigate device 200 and converting the flowable material to a solid material by a suitable technique, such as thermal annealing and/or ultraviolet radiation treating. ILD layer 282 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SiLK (Dow Chemical, Midland, Michigan), polyimide, other low-k dielectric material, or combinations thereof. In the depicted embodiment, ILD layer 282 is a dielectric layer that includes a low-k dielectric material (generally referred to as a low-k dielectric layer). ILD layer 282 can include a multilayer structure having multiple dielectric materials. In some embodiments, a contact etch-stop layer (CESL) is disposed between ILD layer 282 and isolation features 230, epitaxial source/drain features 280A, 280B, and gate spacers 267. The CESL includes a material different than ILD layer 282, such as a dielectric material that is different than the dielectric material of ILD layer 282. For example, where ILD layer 282 includes a low-k dielectric material, the CESL includes silicon and nitrogen, such as silicon nitride or silicon oxynitride. Subsequent to the deposition of ILD layer 282 and/or the CESL, a CMP process and/or other planarization process can be performed until reaching (exposing) a top portion (or top surface) of dummy gate stacks 265. In some embodiments, the planarization process removes hard mask layers of dummy gate stacks 265 to expose underlying dummy gate electrodes of dummy gate stacks 265, such as polysilicon gate electrode layers.

ILD layer 282 may be a portion of a multilayer interconnect (MLI) feature disposed over substrate 202. The MLI feature electrically couples various devices (for example, p-type GAA transistors and/or n-type GAA transistors of multigate device 200, transistors, resistors, capacitors, and/or inductors) and/or components (for example, gate structures and/or epitaxial source/drain features of p-type GAA transistors and/or n-type GAA transistors), such that the various devices and/or components can operate as specified by design requirements of multigate device 200. The MLI feature includes a combination of dielectric layers and electrically conductive layers (e.g., metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of the MLI feature. During operation, the interconnect features are configured to route signals between the devices and/or the components of multigate device 200 and/or distribute signals (for example, clock signals, voltage signals, and/or ground signals) to the devices and/or the components of multigate device 200.

Turning to FIGS. 13A-13D, dummy gate stacks 265 are removed from gate structures 260, thereby exposing semiconductor layer stacks 205 of fins 218A, 218B in n-type gate regions 260-1 and p-type gate regions 260-2. In the depicted embodiment, an etching process completely removes dummy gate stacks 265 to expose semiconductor layers 215 and semiconductor layers 210 in channel regions 264. The etching process is a dry etching process, a wet etching process, other suitable etching process, or combinations thereof. In some embodiments, the etching process is a multi-step etch process. For example, the etching process may alternate etchants to separately remove various layers of dummy gate stacks 265, such as the dummy gate electrode layers, the dummy gate dielectric layers, and/or the hard mask layers. In some embodiments, the etching process is configured to selectively etch dummy gate stacks 265 with minimal (to no) etching of other features of multigate device 200, such as ILD layer 282, gate spacers 267, isolation features 230, semiconductor layers 215, and semiconductor layers 210. In some embodiments, a lithography process, such as those described herein, is performed to form a patterned mask layer that covers ILD layer 282 and/or gate spacers 267, and the etching process uses the patterned mask layer as an etch mask.

Turning to FIGS. 14A-14D, semiconductor layers 215 of semiconductor layer stack 205 (exposed by gate trenches 284) are selectively removed from channel regions 264, thereby forming suspended semiconductor layers 210' in channel regions 264. In the depicted embodiment, an etching process selectively etches semiconductor layers 215 with minimal (to no) etching of semiconductor layers 210 and, in some embodiments, minimal (to no) etching of gate spacers 267 and/or inner spacers 275. In the depicted embodiment, semiconductor layers 215 and cladding layer 250 have same composition (in the depicted embodiment, silicon germanium), and cladding 250 is selectively removed as well. In this case, cladding layer 250 provide etch path such that semiconductor layers 215 can be effectively removed. In some embodiments, semiconductor layers 215 and DBL 204 have similar composition (in the depicted embodiment, silicon germanium), and DBL 204 is selectively removed as well.

Various etching parameters can be tuned to achieve selective etching of semiconductor layers 215, such as etchant composition, etching temperature, etching solution concentration, etching time, etching pressure, source power, RF bias voltage, RF bias power, etchant flow rate, other suitable etching parameters, or combinations thereof. For example, an etchant is selected for the etching process that etches the material of semiconductor layers 215 (in the depicted embodiment, silicon germanium) at a higher rate than the material of semiconductor layers 210 (in the depicted embodiment, silicon) (i.e., the etchant has a high etch selectivity with respect to the material of semiconductor layers 215). The etching process is a dry etching process, a wet etching process, other suitable etching process, or combinations thereof. In some embodiments, a dry etching process (such as an RIE process) utilizes a fluorine-containing gas (for example, $SF_6$) to selectively etch semiconductor layers 215. In some embodiments, a ratio of the fluorine-containing gas to an oxygen-containing gas (for example, $O_2$), an etching temperature, and/or an RF power may be tuned to selectively etch silicon germanium or silicon. In some embodiments, a wet etching process utilizes an etching solution that includes ammonium hydroxide ($NH_4OH$) and water ($H_2O$) to selectively etch semiconductor layers 215. In some embodiments, a chemical vapor phase etching process using hydrochloric acid (HCl) selectively etches semiconductor layers 215.

At least one suspended semiconductor layer 210' is thus exposed in n-type gate regions 260-1 and p-type gate regions 260-2 by gate trenches 284. In the depicted embodiment, each n-type gate region 260-1 and each p-type gate region 260-2 includes four suspended semiconductor layers 210' vertically stacked that will provide four channels through which current will flow between respective epitaxial source/drain features (epitaxial source/drain features 280A or epitaxial source/drain features 280B) during operation of the GAA transistors. Suspended semiconductor layers 210' are thus referred to as channel layers 210' hereinafter. Channel layers 210' in n-type gate regions 260-1 are separated by gaps 286A, and channel layers 210' in p-type gate regions 260-2 are separated by gaps 286B. Channel layers 210' in n-type gate regions 260-1 are also separated from substrate 202 by gaps 286A, and channel layers 210' in p-type gate regions 260-2 are also separated by gaps 286B. A spacing s1 is defined between channel layers 210' along the z-direction in n-type gate regions 260-1, and a spacing s2 is defined between channel layers 210' along the z-direction in p-type gate regions 260-2. Spacing s1 and spacing s2 correspond with a width of gaps 286A and gaps 286B, respectively. In the depicted embodiment, spacing s1 is about equal to s2, though the present disclosure contemplates embodiments where spacing s1 is different than spacing s2. In some embodiments, spacing s1 and spacing s2 are both about equal to thickness t1 of semiconductor layers 215. However, A spacing s3 is defined between bottom channel layer 210' and substrate 202 (particularly, APT feature 240) along the z-direction in n-type gate regions 260-1, and a spacing s4 is defined between bottom channel layer 210' and substrate 202 (particularly, APT feature 246) along the z-direction in p-type gate regions 260-2. s3 and s4 are different from s1 and s2, respectively. In the depicted embodiment, s3 and s4 are greater than s1 and s2, respectively, due to the thickness of DBL 204 is greater than the thickness of semiconductor layers 215.

Further, channel layers 210' in n-type gate regions 260-1 have a length L1 along the x-direction and a width w1 along the y-direction, and channel layers 210' in p-type gate regions 260-2 have a length L2 along the y-direction and a width w2 along the x-direction. In the depicted embodiment, length L1 is about equal to length L2, and width w1 is about equal to width w2, though the present disclosure contemplates embodiments where length L1 is different than length L2 and/or width w1 is different than width w2. In some embodiments, length L1 and/or length L2 is about 10 nm to about 50 nm. In some embodiments, width w1 and/or width w2 is about 4 nm to about 10 nm. In some embodiments, each channel layer 210' has nanometer-sized dimensions and can be referred to as a "nanowire," which generally refers to a channel layer suspended in a manner that will allow a metal gate to physically contact at least two sides of the channel layer, and in GAA transistors, will allow the metal gate to physically contact at least four sides of the channel layer (i.e., surround the channel layer). In such embodiments, a vertical stack of suspended channel layers can be referred to as a nanostructure, and the process depicted in FIGS. 14A-14D can be referred to as a channel nanowire release process. In some embodiments, after removing semiconductor layers 215, an etching process is performed to modify a profile of channel layers 210' to achieve desired dimensions and/or desired shapes (e.g., cylindrical-shaped (e.g., nanowire), rectangular-shaped (e.g., nanobar), sheet-shaped (e.g., nanosheet), etc.). The present disclosure further contemplates embodiments where the channel layers 210' (nanowires) have sub-nanometer dimensions depending on design requirements of multigate device 200.

Turning to FIGS. 15A-15D, a gate dielectric layer is formed over multigate device 200, where the gate dielectric layer partially fills gate trenches 284 and wraps (surrounds) channel layers 210' in n-type gate regions 260-1 and p-type gate regions 260-2 of gate structures 260. In the depicted embodiment, the gate dielectric layer includes an interfacial layer 288 and a high-k dielectric layer 290, where interfacial layer 288 is disposed between the high-k dielectric layer 290 and channel layers 210'. In furtherance of the depicted embodiment, interfacial layer 288 and high-k dielectric layer 290 partially fill gaps 286A between channel layers 210' and between channel layers 210' and substrate 202 in n-type gate regions 260-1 and partially fill gaps 286B between channel layers 210' and between channel layers 210' and substrate 202 in p-type gate regions 260-2. In some embodiments, interfacial layer 288 and/or high-k dielectric layer 290 are also disposed on substrate 202, isolation features 230, and/or gate spacers 267. Interfacial layer 288 includes a dielectric material, such as $SiO_2$, HfSiO, SiON, other silicon-comprising dielectric material, other suitable dielectric material, or combinations thereof. High-k dielectric layer 290 includes a high-k dielectric material, such as $HfO_2$, HfSiO, $HfSiO_4$, HfSiON, HfLaO, HfTaO, HfTiO, HfZrO, HfAlOx, ZrO, $ZrO_2$, $ZrSiO_2$, AlO, AlSiO, $Al_2O_3$, TiO, $TiO_2$, LaO, LaSiO, $Ta_2O_3$, $Ta_2O_3$, $Y_2O_3$, $SrTiO_3$, BaZrO, $BaTiO_3$ (BTO), (Ba, Sr)$TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). Interfacial layer 288 is formed by any of the processes described herein, such as thermal oxidation, chemical oxidation, ALD, CVD, other suitable process, or combinations thereof. In some embodiments, interfacial layer 288 has a thickness of about 0.5 nm to about 1 nm. High-k dielectric layer 290 is formed by any of the processes described herein, such as ALD, CVD, PVD, oxidation-based deposition process, other suitable process, or combinations thereof. In some embodiments, high-k dielectric layer 290 has a thickness of about 1 nm to about 2 nm.

Turning to FIGS. 16A-16D, gate electrode materials are formed in the gate trenches 284 to form a metal gate stack 360A in the gate region 260-1 and a metal gate stack 360B in the gate region 260-2. The gate electrode of gate stack 360A in the gate region 260-1 includes an n-type work function layer 310 and a fill metal 330. The gate electrode of gate stack 360B in the gate region 260-2 includes an p-type work function layer 320 and a fill metal 330. Gate electrodes may further include other conductive materials, such as capping layer. Blocking layer or both.

In the gate stack 360A for nFET, an n-type work function layer 310 is formed over multigate device 200, particularly over high-k dielectric layer 290 in n-type gate regions 260-1 of gate structures 260. For example, an ALD process conformally deposits n-type work function layer 310 on high-k dielectric layer 290, such that n-type work function layer 310 has a substantially uniform thickness and partially fills gate trenches 284 along the gate length direction in n-type gate regions 260-1. In n-type gate regions 260-1, n-type work function layer 310 is disposed on high-k dielectric layer 290 and surrounds high-k dielectric layer 290, interfacial layer 288, and channel layers 210'. For example, n-type work function layer 310 is disposed along sidewalls, tops, and bottoms of channel layers 210'. In the depicted embodiment, a thickness of n-type work function layer 310 may partially fill or completely fill remaining portions of gaps 286A between channel layers 210' and between channel layers 210' and substrate 202 in n-type gate regions 260-1. In some embodiments, n-type work function layer 310 has a thickness of about 1 nm to about 5 nm. N-type work function layer 310 includes any suitable n-type work function material, such as Ti, Al, Ag, Mn, Zr, TiAl, TiAlC, TiAlSiC, TaC, TaCN, TaSiN, TaAl, TaAlC, TaSiAlC, TiAlN, other n-type work function material, or combinations thereof. In the depicted embodiment, n-type work function layer 310 includes aluminum. For example, n-type work function layer 310 includes titanium and aluminum, such as TiAl, TiAlC, TaSiAl, or TiSiAlC. Alternatively, n-type work function layer 310 is formed using another suitable deposition process, such as CVD, PVD, HDPCVD, MOCVD, RPCVD, PECVD, LPCVD, ALCVD, APCVD, spin coating, plating, other deposition process, or combinations thereof.

In the gate stack 360B for pFET, a p-type work function layer 320 is formed over multigate device 200, particularly over high-k dielectric layer 290 in n-type gate regions 260-1 of gate structures 260. For example, an ALD process conformally deposits p-type work function layer 320 on high-k dielectric layer 290, such that p-type work function layer 320 has a substantially uniform thickness and partially or completely fills gate trenches 286. In p-type gate regions 260-2, p-type work function layer 320 is disposed on high-k dielectric layer 290 and surrounds high-k dielectric layer 290, interfacial layer 288, and channel layers 210'. For example, p-type work function layer 320 is disposed along sidewalls, tops, and bottoms of channel layers 210'. A thickness of p-type work function layer 320 is configured to at least partially fill gaps 286B between channel layers 210' and between channel layers 210' and substrate 202. In some embodiments, p-type work function layer 320 has a thickness of about 1 nm to about 10 nm. P-type work function layer 320 includes any suitable p-type work function material, such as TiN, TaN, TaSN, Ru, Mo, Al, WN, WCN ZrSi$_2$, MoSi$_2$, TaSi$_2$, NiSi$_2$, other p-type work function material, or combinations thereof. In the depicted embodiment, p-type work function layer 300 includes titanium and nitrogen, such as TiN. P-type work function layer 300 can be formed using another suitable deposition process, such as CVD, PVD, HDPCVD, MOCVD, RPCVD, PECVD, LPCVD, ALCVD, APCVD, spin coating, plating, other deposition process, or combinations thereof.

A metal fill (or bulk) layer 330 is formed over multigate device 200, particularly over n-type work function layer 310 in n-type gate regions 260-1 and over p-type work function layer 320 in p-type gate regions 260-2. For example, a CVD process or a PVD process deposits metal fill layer 330 on n-type work function layer 310 and p-type work function layer 320, such that metal fill layer 330 fills any remaining portion of gate trenches 286, including any remaining portions of gaps 286A in n-type gate regions 260-1 and any remaining portions of gaps 286B in p-type gate regions 260-2. Metal fill layer 330 includes a suitable conductive material, such as Al, W, and/or Cu. Metal fill layer 330 may additionally or collectively include other metals, metal oxides, metal nitrides, other suitable materials, or combinations thereof. In some implementations, a blocking layer is optionally formed over n-type work function layer 310 and p-type work function layer 320 before forming metal fill layer 330, such that metal fill layer 330 is disposed on the blocking layer. For example, an ALD process conformally deposits the blocking layer on n-type work function layer 310 and p-type work function layer 320, such that the blocking layer has a substantially uniform thickness and partially fills gate trenches 286. The blocking layer includes a material that blocks and/or reduces diffusion between gate layers. Alternatively, metal fill layer 330 and/or the blocking layer are formed using another suitable deposition process, such as ALD, CVD, PVD, HDPCVD, MOCVD, RPCVD, PECVD, LPCVD, ALCVD, APCVD, spin coating, plating, other deposition process, or combinations thereof.

Since gate stack 360A and gate stack 360B are different in composition (particularly, different work function materials), gate stack 360A and gate stack 360B are formed in various suitable procedures. In some embodiments, gate stack 360A and gate stack 360B are formed separately. For example, gate stack 360A is formed in n-type gate region 260-1 while p-type gate region 260-2 is covered by a patterned mask. Then, gate stack 360B is formed in p-type gate region 260-2 while n-type gate region 260-1 is covered by another patterned mask. In some embodiments, the sequence may be opposite, in which gate stack 360B is formed and gate stack 360A is formed thereafter. In yet some embodiments, gate stack 360A and gate stack 360B are collectively formed. For example, an n-type work function material is deposited in both n-type gate region 260-1 and p-type gate region 260-2; then the n-type work function material is removed from p-type gate region 260-2 by lithography process and etch; a p-type work function material is then deposited. After the metal fill layer 330 is deposited in the gate trenches 286, a CMP process is applied to remove excessive the fill metal and planarize the top surface.

The multigate device 200 thus formed is illustrated in FIGS. 16A~16D. In multigate device 200, the APT feature 240 is formed in the fin active region 218A and is underlying the gate stack 360A. Particularly, the APT feature 240 vertically spans from the top surface to the bottom surface of the isolation feature 230A. Especially, the gate stack 360A includes a portion inserted between the APT feature 240 and the bottom channel layer 210', and this portion of the gate stack 360A has a thickness greater than each of other portions inserted between adjacent channel layers 210'. This is because DBL 204 and each of semiconductor layers 215 have different thickness, as described above. Furthermore, the isolation feature 230A includes at least three layers, liner 232, solid doping source material layer 234 (containing p-type dopant) and filling dielectric material layer 236. Similarly, the isolation feature 230B includes liner 232, solid doping source material layer 244 (containing n-type dopant) and filling dielectric material layer 236. The isolation feature 230A (or 230B) may have different structure as illustrated in FIGS. 17A~17D. Particularly, solid doping source material layer 234 (or 244) is a topmost portion of isolation feature 230A (or 230B).

Fabrication can proceed to continue fabrication of multi-gate device 200. For example, various contacts can be formed to facilitate operation of the n-type GAA transistors and the p-type GAA transistors. For example, one or more ILD layers, similar to ILD layer 282, and/or CESL layers can be formed over substrate 202 (in particular, over ILD layer 280 and gate structures 260). Contacts can then be formed in ILD layer 282 and/or ILD layers disposed over ILD layer 282. For example, contacts are respectively electrically and/or physically coupled with gate structures 260 and contacts are respectively electrically and/or physically coupled to source/drain regions of the n-type GAA transistors and the p-type GAA transistors (particularly, epitaxial source/drain features 280A, 280B). Contacts include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. In some implementations, ILD layers disposed over ILD layer 282 and the contacts (for example, extending through ILD layer 282 and/or the other ILD layers) are a portion of the MLI feature described above.

The present disclosure provides for many different embodiments. An exemplary method forming multigate device having an APT feature includes forming an isolation feature having a solid doping source material layer with corresponding dopant; forming a DBL on substrate to prevent diffusion of the dopant to the channels; and performing a thermal process to drive the dopant into the fin active region to form the APT feature. The disclosed method is processing-compatible and cost-effective with further advantages including enhanced device performance.

In one example aspect, the present disclosure provides a method of semiconductor fabrication. The method includes forming a diffusion blocking layer on a semiconductor substrate; forming channel material layers over the diffusion blocking layer; patterning the semiconductor substrate, the channel material layers, and the diffusion blocking layer to form a trench in the semiconductor substrate, thereby defining an active region being adjacent the trench; filling the trench with a dielectric material layer and a solid doping source material layer containing a dopant; and driving the dopant from the solid doping source material layer to the active region, thereby forming an anti-punch-through (APT) feature in the active region.

In another example aspect, the present disclosure provides a method of semiconductor fabrication. The method includes forming a diffusion blocking layer on a semiconductor substrate; forming channel material layers over the diffusion blocking layer; patterning the semiconductor substrate, the channel material layers, and the diffusion blocking layer to form a trench in the semiconductor substrate, thereby defining a fin active region being adjacent the trench; filling the trench with a dielectric material layer to form an isolation feature; recessing the isolation feature, thereby forming a fin structure in the fin active region; and thereafter depositing a borosilicate glass (BSG) layer on the isolation feature.

In another example aspect, the present disclosure provides a semiconductor structure. The semiconductor structure includes an active region in a semiconductor substrate and spanning from a first shallow trench isolation (STI) feature to a second STI feature; channel layers of a first type conductivity, being disposed on the semiconductor substrate, and spanning between the first sidewall and the second sidewall; a gate stack formed on the semiconductor substrate and extended to wrap around each of the channel layers; and an anti-punch through (APT) feature of the first type conductivity and containing a first dopant, wherein the APT feature is disposed underlying the gate stack, wherein each of the first and second STI features includes a solid doping source material layer containing the first dopant, and wherein the first and second STI feature includes a top surface below a top surface of the APT feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a diffusion blocking layer on a semiconductor substrate;
    forming channel material layers over the diffusion blocking layer, wherein the diffusion blocking layer is underlying the channel material layers;
    patterning the semiconductor substrate, the channel material layers, and the diffusion blocking layer to form a trench in the semiconductor substrate, thereby defining an active region being adjacent the trench and exposing sidewalls of the diffusion blocking layer in the trench;
    forming an isolation feature in the trench, wherein the active region is protruding above the isolation feature, and wherein the isolation feature includes a dielectric liner and a dielectric material layer on the dielectric liner;
    forming a solid doping source material layer on the isolation feature, wherein the solid doping source material layer includes a dopant; and
    driving the dopant from the solid doping source material layer to the active region, thereby forming an anti-punch-through (APT) feature in the active region.

2. The method of claim 1, wherein
    the forming of the diffusion blocking layer includes epitaxially growing a semiconductor material layer on the semiconductor substrate, wherein the semiconductor material layer is free of carbon; and
    the forming of channel material layers includes epitaxially growing a plurality of first semiconductor material films and a plurality of second semiconductor material films in an interleaving configuration on the diffusion blocking layer, wherein the first semiconductor material films and second semiconductor material films are different in composition.

3. The method of claim 2, wherein
    the first semiconductor material films are silicon films;
    the second semiconductor material films are silicon germanium films; and
    the semiconductor material layer is a silicon germanium layer and is different from the second semiconductor material films in composition, wherein the diffusion blocking layer has a first thickness greater than 10 nm, and each of the second semiconductor material films has a second thickness less than 7 nm.

4. The method of claim 3, wherein the semiconductor material layer has a germanium concentration greater than that of the second semiconductor material films.

5. The method of claim 4, wherein the semiconductor material layer has a thickness greater than each one of the second semiconductor material films.

6. The method of claim 5, wherein the semiconductor material layer includes a germanium concentration ranging between 25% and 50% (atomic percentage) and has a thickness ranging between 10 nm and 15 nm.

7. The method of claim 1, further comprising performing an implantation to introduce a p-type dopant into the semiconductor substrate in a first region, thereby forming a p-type doped well in the first region, prior to the patterning the semiconductor substrate, wherein the solid doping source material layer is borosilicate glass (BSG) layer and directly contacts a top surface of the dielectric material layer.

8. The method of claim 2, after the driving the dopant from the solid doping source material layer to the active region, further comprising
   forming a dummy gate stack on the channel material layers;
   forming source/drain features on sides of the dummy gate stack;
   forming an interlevel dielectric (ILD) layer on the channel material layers;
   removing the dummy gate stack, resulting in a gate trench;
   selectively removing the second semiconductor material films, thereby forming suspended channels over the APT feature; and
   forming a metal gate stack in the gate trench and extended to wrap around the suspended channels.

9. The method of claim 8, wherein
   the solid doping source material layer is a borosilicate glass (BSG) layer; and
   the driving the dopant from the solid doping source material layer to the active region includes performing a thermal annealing process to the BSG layer with a temperature greater than 900° C. such that to drive boron from the BSG layer into a portion of the active region below the diffusion blocking layer.

10. The method of claim 1, wherein the forming an isolation feature in the trench includes
    forming the dielectric liner in the trench;
    forming the dielectric material layer on the dielectric liner within the trench; and
    depositing a borosilicate glass (BSG) layer on the dielectric material layer.

11. The method of claim 1, wherein
    the solid doping source material layer is a borosilicate glass (BSG) layer on the isolation feature, wherein the dielectric liner includes a vertical portion and a horizontal portion, and wherein the BSG layer directly contacts the dielectric material layer and the vertical portion of the dielectric liner.

12. A method, comprising:
    forming a diffusion blocking layer on a semiconductor substrate;
    forming channel material layers over the diffusion blocking layer;
    patterning the semiconductor substrate, the channel material layers, and the diffusion blocking layer to form a trench in the semiconductor substrate, thereby defining a fin active region being adjacent the trench; and
    forming an isolation feature in the trench, wherein the fin active region is protruding above the isolation feature, and wherein the isolation feature includes a dielectric liner and a dielectric material layer on the dielectric liner; and
    depositing a borosilicate glass (BSG) layer on the isolation feature, wherein the BSG layer directly contacts the dielectric material layer and a vertical portion of the dielectric liner.

13. The method of claim 12, wherein the dielectric liner includes the vertical portion and a horizontal portion, and wherein the horizontal portion of the dielectric liner is distanced away from the BSG layer.

14. The method of claim 12, further comprising driving boron from the BSG layer to the fin active region by a thermal annealing process, thereby forming an anti-punch-through (APT) feature in the fin active region, wherein the APT feature is underlying the diffusion blocking layer.

15. The method of claim 14, after the driving boron from the BSG layer to the fin active region, further comprising
    forming a dummy gate stack on the channel material layers;
    forming source/drain features on sides of the dummy gate stack;
    forming an interlevel dielectric (ILD) layer on the channel material layers;
    removing the dummy gate stack, resulting in a gate trench;
    selectively removing semiconductor material films among the channel material layers, thereby forming suspended channels over the APT feature; and
    forming a metal gate in the gate trench, wherein the metal gate is extended to wrap around the suspended channels.

16. The method of claim 12, wherein
    the forming of the diffusion blocking layer includes epitaxially growing a semiconductor material layer on the semiconductor substrate; and
    the forming of channel material layers includes epitaxially growing a plurality of first semiconductor material films and a plurality of second semiconductor material films in an interleaving configuration on the diffusion blocking layer, wherein
    the first semiconductor material films are silicon films,
    the second semiconductor material films are silicon germanium films,
    the semiconductor material layer is a silicon germanium layer, and
    the semiconductor material layer has a germanium concentration greater than that of the second semiconductor material films and has a thickness greater than each one of the second semiconductor material films.

17. A method, comprising:
    forming a diffusion blocking layer on a semiconductor substrate;
    epitaxially growing silicon films and silicon germanium films in an interleaving configuration on the diffusion blocking layer, wherein the diffusion blocking layer includes silicon germanium with a germanium concentration greater than that of the silicon germanium films;
    patterning the semiconductor substrate, the silicon films and the silicon germanium films, and the diffusion blocking layer to form a trench in the semiconductor substrate, thereby defining a fin active region being adjacent the trench;
    forming an isolation feature in the trench, wherein the fin active region is protruding above the isolation feature, and wherein the isolation feature includes a dielectric liner and a dielectric material layer on the dielectric liner; and depositing a borosilicate glass (BSG) layer directly on the isolation feature, wherein the BSG layer directly contacts the dielectric material layer and a vertical portion of the dielectric liner.

18. The method of claim 17, further comprising driving boron from the BSG layer to the fin active region by a thermal annealing process, thereby forming an anti-punch-through (APT) feature in the fin active region, wherein the APT feature is underlying the diffusion blocking layer.

19. The method of claim 18, after the driving boron from the BSG layer to the fin active region, further comprising forming a dummy gate stack on the silicon films;

forming source/drain features on sides of the dummy gate stack;

forming an interlevel dielectric (ILD) layer on the silicon films;

removing the dummy gate stack, resulting in a gate trench;

selectively removing the silicon germanium films, thereby forming suspended channels over the APT feature; and forming a metal gate in the gate trench, wherein the metal gate is extended to wrap around each of the suspended channels.

20. The method of claim 17, wherein the diffusion blocking layer has a thickness greater than 10 nm and each one of the silicon germanium films has a thickness less than 7 nm.

* * * * *